(12) United States Patent
Kawase

(10) Patent No.: US 8,174,016 B2
(45) Date of Patent: May 8, 2012

(54) SEMICONDUCTOR DEVICE, ACTIVE MATRIX DEVICE, ELECTRO-OPTICAL DEVICE, AND ELECTRONIC APPARATUS

(75) Inventor: Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 141 days.

(21) Appl. No.: 12/764,320

(22) Filed: Apr. 21, 2010

(65) Prior Publication Data

US 2010/0270563 A1 Oct. 28, 2010

(30) Foreign Application Priority Data

Apr. 23, 2009 (JP) .................................. 2009-105641
Mar. 9, 2010 (JP) .................................. 2010-052402

(51) Int. Cl.
*H01L 29/04* (2006.01)
*H01L 51/00* (2006.01)
(52) U.S. Cl. . 257/59; 257/40; 257/E27.06; 257/E33.053
(58) Field of Classification Search .................... 257/40, 257/59, 88, 704, E21.704, E27.06, E33.053
See application file for complete search history.

(56) References Cited

U.S. PATENT DOCUMENTS

2005/0250262 A1* 11/2005 Suzuki et al. ................. 438/151

FOREIGN PATENT DOCUMENTS

JP A 2004-006782 1/2004

* cited by examiner

*Primary Examiner* — A. Sefer
*Assistant Examiner* — Nikolay Yushin
(74) *Attorney, Agent, or Firm* — Oliff & Berridge, PLC

(57) ABSTRACT

A method of manufacturing a semiconductor device includes: forming, on one surface of a substrate, source electrodes and drain electrodes, a semiconductor layer provided between the source electrodes and the drain electrodes, and a gate insulator layer provided to cover a surface of the semiconductor layer; forming an insulator layer on a surface of the gate insulator layer, the insulator layer having through portions; and forming electrodes on the gate insulator layer around the bottom of the through portions and on the insulator layer in the vicinity of the through portions by a vapor film formation method simultaneously so as not to come into contact with each other, forming gate electrodes by using the electrodes formed on the gate insulator layer, and forming pixel electrodes electrically connected to the source electrodes or the drain electrodes by using the electrodes foamed on the insulator layer.

6 Claims, 15 Drawing Sheets

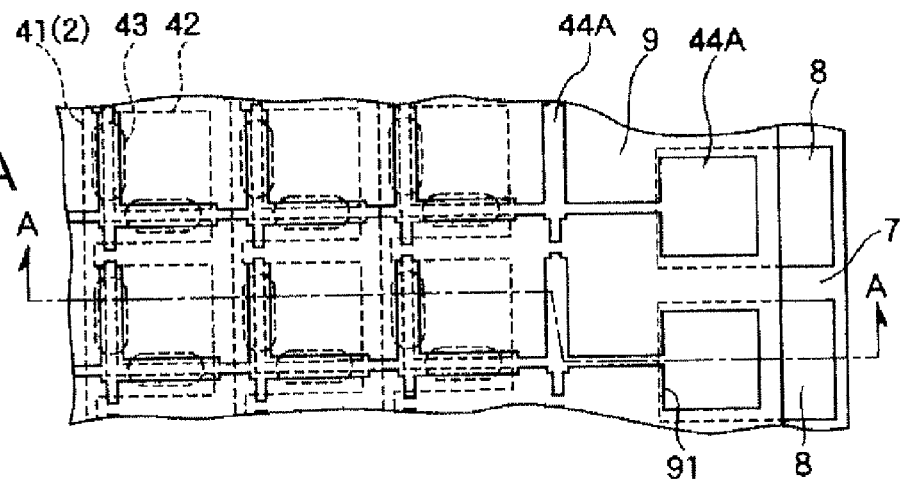
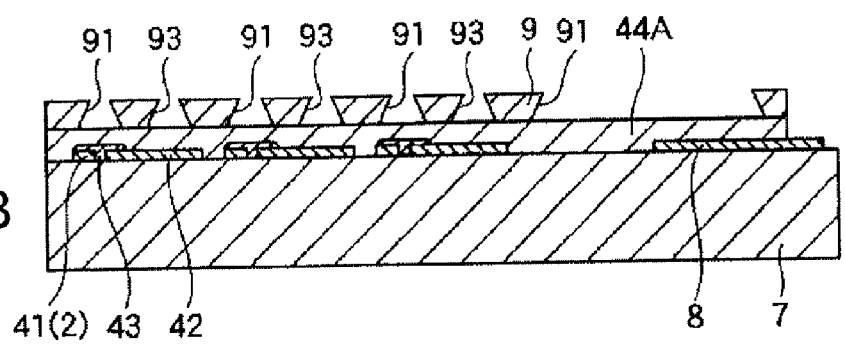

SEMICONDUCTOR DEVICE, ACTIVE MATRIX DEVICE, ELECTRO-OPTICAL DEVICE, AND ELECTRONIC APPARATUS

The entire disclosure of Japanese Patent Application No. 2009-105641, filed Apr. 23, 2009 and 2010-052402, filed Mar. 9, 2010 are expressly incorporated by reference herein.

BACKGROUND

1. Technical Field

The present invention relates to a method of manufacturing a semiconductor device, a semiconductor device, an active matrix device, an electro-optical device, and an electronic apparatus.

2. Related Art

For example, an active matrix driving LCD (Liquid Crystal Display) panel is provided with an active matrix device which includes a plurality of pixel electrodes and switching elements provided to correspond to the pixel electrodes (for example, see JP-A-2004-6782).

In general, the active matrix device uses thin-film transistors (TFTs) as switching elements.

As the TFTs, a top gate structure is known in which source and drain electrodes and a semiconductor layer are formed on a substrate, and a gate insulator layer and a gate electrode are laminated on the source and drain electrodes and the semiconductor layer in that order. In general, a pixel electrode is provided on the gate insulator layer of the TFT. That is, the gate electrode and the pixel electrode arranged to be separated from each other are formed directly on the gate insulator layer.

However, in such an active matrix device, it is necessary to pattern a conductor layer uniformly formed on a gate insulating film by etching to form a gate electrode and a pixel electrode.

For this reason, in the active matrix device of the related art, it is necessary to carry out etching for patterning or etching so as to remove a resist layer used as a mask at the time of etching, and the number of etching processes increases. The increase in the number of etching processes causes complexity of the manufacturing process and deterioration in productivity.

SUMMARY

An advantage of some aspects of the invention is that it provides a method of manufacturing a semiconductor device with excellent productivity, a semiconductor device, an active matrix device, an electro-optical device, and an electronic apparatus.

This advantage can be achieved by the following configuration.

An aspect of the invention provides a method of manufacturing a semiconductor device. The method includes forming, on one surface of a substrate, source electrodes and drain electrodes provided to be separated from each other, a semiconductor layer provided at least between the source electrodes and the drain electrodes, and a gate insulator layer provided so as to cover a surface of the semiconductor layer opposite to the substrate, forming an insulator layer on a surface of the gate insulator layer opposite to the semiconductor layer, the insulator layer having through portions which pass therethrough in the thickness direction, and forming electrodes respectively on the gate insulator layer around the bottom of the respective through portions and on the insulator layer in the vicinity of the through portions by a vapor film formation method simultaneously so as not to come into contact with each other, forming gate electrodes by using the electrodes formed on the gate insulator layer, and forming pixel electrodes electrically connected to the source electrodes or the drain electrodes by using the electrodes formed on the insulator layer.

With this aspect, the number of etching processes can be reduced, as compared with a case where a conductor layer uniformly formed on a gate insulating film is patterned by etching to form gate electrodes and pixel electrodes. As a result, excellent productivity can be achieved.

In the method according to the aspect of the invention, the edge of an opening of each through portion is preferably located inside the edge of the bottom of the through portion in plan view. Further, the through portions are preferably formed with a decreasing inner diameter (width) from the opening of each through portion toward the bottom of the through portion.

With this configuration, in the forming of the electrodes, the electrodes can be respectively formed on the gate insulator layer around the bottom of the respective through portions and on the insulator layer in the vicinity of the through portions by the vapor film formation method simultaneously so as not to come into contact with each other. In at least a partial range of each through portion in the depth direction, a portion may be formed with an increasing width, and in a range other than the portion with an increasing width, a portion may be formed with a constant or decreasing width. The portion with an increasing width may increase in width continuously or in a stepwise manner.

The method according to the aspect of the invention may further include, after the forming of the insulator layer and before the forming of the electrodes, forming conductor portions to pass through the insulator layer and the gate insulator layer in the thickness direction and to provide electrical conduction to the source electrodes or the drain electrodes. In the forming of the electrodes, the pixel electrodes and the source electrodes or the drain electrodes are preferably electrically connected to each other through the conductor portions.

With this configuration, even when the gate insulator layer is present between the source electrodes or the drain electrodes and the pixel electrodes, electrical conduction can be provided between the source electrodes or the drain electrodes and the pixel electrodes.

In the method according to the aspect of the invention, in the forming of the conductor portions, a liquid material containing a conductive material is preferably applied and hardened or solidified to form the conductor portions.

With this configuration, the conductor portions can be formed comparatively simply and reliably to have a desired dimension at desired positions with high accuracy.

In the method according to the aspect of the invention, the liquid material preferably exhibits solubility to the gate insulator layer.

With this configuration, a step of punching holes in advance at the portions of the gate insulator layer, at which the conductor portions are to be formed, prior to applying the liquid material is not required. As a result, the manufacturing process of the semiconductor device can be further simplified, and thus productivity can be further increased.

In the method according to the aspect of the invention, in the forming of the conductor portions, the conductor portions are preferably formed such that a concave portion formed at an end surface of each conductor portion facing the insulator layer is widened from the gate insulator layer side toward the corresponding pixel electrode side in accordance with a decrease in volume due to the liquid material being hardened or solidified.

With this configuration, the conductor portions and the pixel electrodes can be electrically connected to each other simply and reliably.

In the method according to the aspect of the invention, the forming of the electrodes preferably includes partially cutting or removing the electrodes formed on the gate insulator layer or the electrodes formed on the insulator layer.

With this configuration, adjacent pixel electrodes or gate electrodes can be individualized (isolated from each other). Such a separation step is carried out comparatively simply by laser or machining.

Another aspect of the invention provides a method of manufacturing a semiconductor device. The method includes forming, on a surface of a substrate, source electrodes and drain electrodes provided to be separated from each other, and a semiconductor layer provided at least between the source electrodes and the drain electrodes, forming an insulator layer on a surface opposite to the semiconductor layer, the insulator layer having through portions which pass therethrough in the thickness direction, forming a gate insulator layer so as to cover a surface of the semiconductor layer opposite to the substrate around the bottom of the respective through portions, and forming electrodes respectively on the gate insulator layer inside the respective through portions and on the insulator layer in the vicinity of the respective through portions by a vapor film formation method simultaneously so as not to come into contact with each other, forming gate electrodes by using the electrodes formed on the gate insulator layer, and forming pixel electrodes electrically connected to the source electrodes or the drain electrodes by using the electrodes formed on the insulator layer.

With this configuration, it is possible to provide a semiconductor device with excellent productivity.

Yet another aspect of the invention provides a semiconductor device which is manufactured by the method of manufacturing a semiconductor device according to the aspect of the invention.

With this configuration, it is possible to provide a semiconductor device with excellent productivity.

Still another aspect of the invention provides a semiconductor device. The semiconductor device includes a substrate, transistors each having a source electrode and a drain electrode provided on a surface of the substrate to be separated from each other, a semiconductor layer provided at least between the source electrode and the drain electrode, a gate insulator layer provided so as to cover a surface of the semiconductor layer opposite to the substrate, and a gate electrode provided on a surface of the gate insulator layer opposite to the semiconductor layer, an insulator layer provided on a surface of the gate insulator layer opposite to the semiconductor layer, and pixel electrodes each provided on a surface of the insulator layer opposite to the gate insulator layer and electrically connected to the corresponding source electrode or the corresponding drain electrode. The insulator layer has through portions, each of which passes therethrough in the thickness direction with an increasing width from the corresponding pixel electrode side toward the gate insulator layer side, and the gate electrode is provided on the gate insulator layer around the bottom of the corresponding through portion.

With this configuration, it is possible to provide a semiconductor device with excellent productivity. Further, it is hard for an electrode material to be stuck to the walls of the through portions, such that the pixel electrodes and the gate electrodes can be prevented from short-circuiting. As a result, reliability of the semiconductor device can be improved.

In the semiconductor device according to yet another aspect of the invention, conductor portions may be provided so as to pass through the gate insulator layer and the insulator layer in the thickness direction and to electrically connect the source electrodes or the drain electrodes and the pixel electrodes to each other.

With this configuration, even when the gate insulator layer is present between the source electrodes or the drain electrodes and the pixel electrodes, electrical conduction can be provided between the source electrodes or the drain electrodes and the pixel electrodes.

In the semiconductor device according to yet another aspect of the invention, the gate electrodes and the pixel electrodes are preferably formed simultaneously by a vapor film formation method.

With this configuration, it is possible to provide a semiconductor device with excellent productivity.

Still yet another aspect of the invention provides an active matrix device including the above-described semiconductor device.

With this configuration, it is possible to provide an active matrix device with excellent productivity.

Further another aspect of the invention provides an electro-optical device including the above-described active matrix device.

With this configuration, it is possible to provide an electro-optical device with excellent productivity.

Still further another aspect of the invention provides an electronic apparatus including the above-described electro-optical device.

With this configuration, it is possible to provide an electronic apparatus with excellent productivity.

BRIEF DESCRIPTION OF THE DRAWINGS

The invention will be described with reference to the accompanying drawings, wherein like members reference like elements.

FIGS. 6A and 6B are diagrams illustrating a step of forming an insulator layer in the manufacturing method of the active matrix device shown in FIG. 1.

DESCRIPTION OF EXEMPLARY EMBODIMENTS

Hereinafter, a method of manufacturing semiconductor device, a semiconductor device, an active matrix device, an electro-optical device, and an electronic apparatus according to embodiments of the invention will be described with reference to the accompanying drawings.

Active Matrix Device

Figure 1:
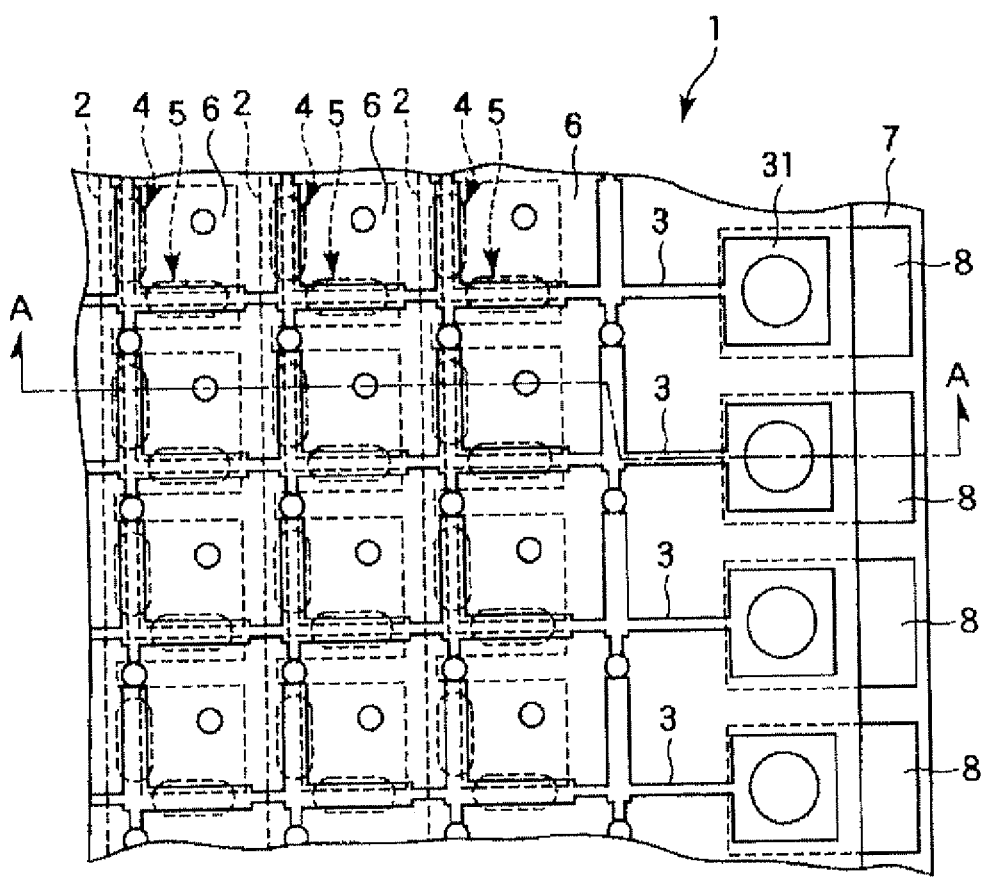
FIG. 1 is, a plan view showing an active matrix device including a semiconductor device according to an embodiment of the invention.
Figure 2:
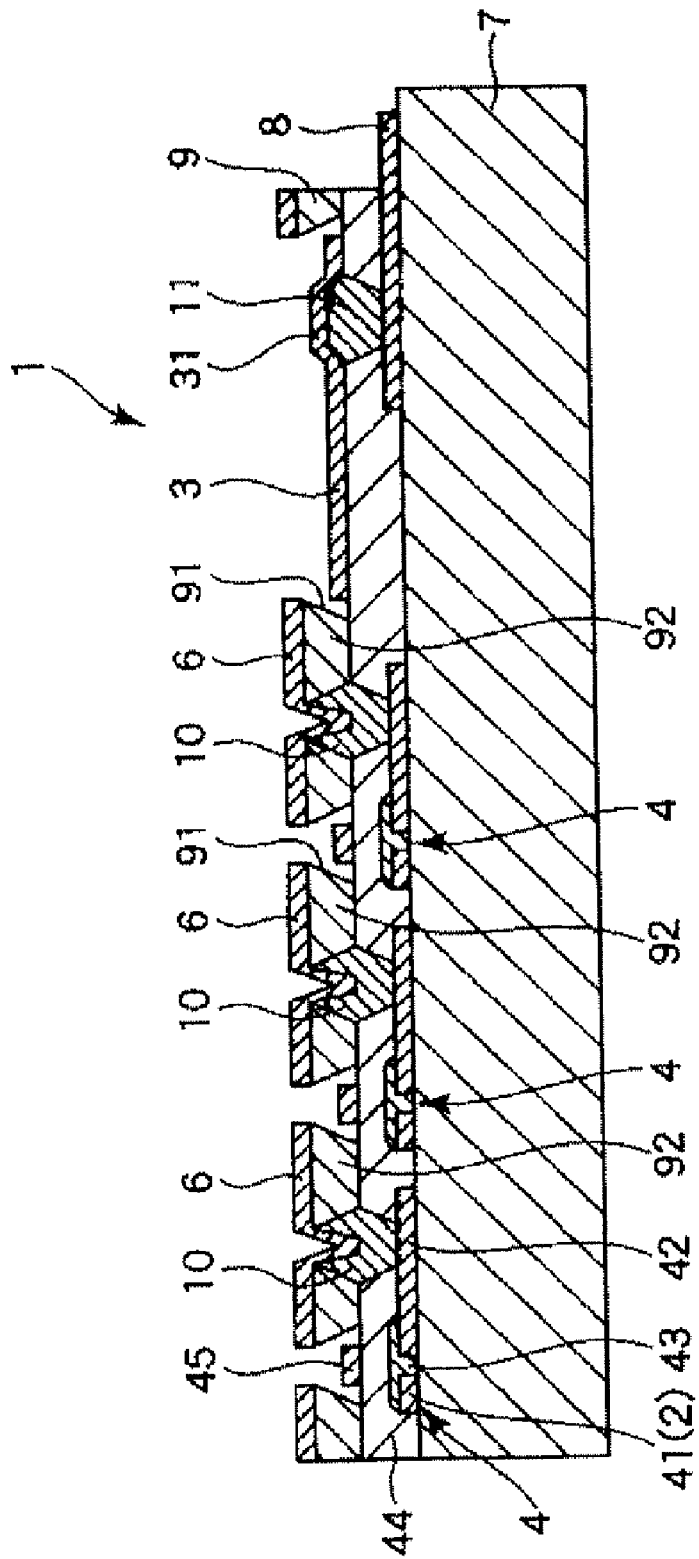
FIG. 2 is a sectional view taken along the line A-A of FIG. 1.

FIG. 1 is a plan view showing an active matrix device including a semiconductor device according to an embodiment of the invention. FIG. 2 is a sectional view taken along the line A-A of FIG. 1. In the following description, for convenience of description, the upper side of FIG. 2 is referred to as "above", and the lower side of FIG. 2 is referred to as "below".

The active matrix device 1 shown in FIG. 1 has, on a substrate 7, a plurality of first wiring lines 2, a plurality of second wiring lines 3 provided to intersect the plurality of first wiring lines 2, transistors 4 and provided around the respective intersections of the first wiring lines 2 and the second wiring lines 3, and a plurality of pixel electrodes 6 provided to correspond to the pairs of transistors 4 and 5.

As shown in FIG. 2, each of the transistors 4 and 5 has a source electrode 41 and a drain electrode 42, a semiconductor layer 43, a gate insulator layer 44, and a gate electrode 45.

In this embodiment, with regard to a plurality of transistors 4 and 5 provided in parallel in the left-right direction (row direction) of FIG. 1 from among a plurality of transistors 4 and 5, their gate electrodes 45 are formed integrally to form the second wiring line 3. One end 31 of the second wiring line 3 is electrically connected to a connection electrode 8 provided on the substrate 7 through a conductor portion (conductor post) 11. An FPC (Flexible Printed Circuit) board is bonded to the connection electrode 8, for example, through an ACF (Anisotropic Conductive Film) or an ACP (Anisotropic Conductive Paste), such that electrical connection to the outside is provided.

In each of the transistors 4 and 5, the source electrode 41 is electrically connected to the corresponding first wiring line 2, and the drain electrode 42 is electrically connected to the corresponding pixel electrode (individual electrode) 6 through a conductor portion (conductor post) 10. Though not shown, one end of the first wiring line 2 forms a connection electrode on the substrate 7, such that, similarly to the second wiring line 3, electrical connection to the outside is provided.

In this embodiment, a plurality of first wiring lines 2 and a plurality of second wiring lines 3 are arranged so as to be orthogonal to each other. A plurality of first wiring lines 2 are provided for row selection, and a plurality of second wiring lines 3 are provided for column selection. That is, one of the first wiring lines 2 and the second wiring lines 3 is used as data lines, and the other one is used as scanning lines. Row selection and column selection are carried out by using a plurality of first wiring lines 2 and a plurality of second wiring lines 3, such that desired transistors 4 and 5 can be selectively operated.

A plurality of pixel electrodes 6 are arranged in a matrix to correspond to a plurality of transistors 4 and 5.

Hereinafter, the respective units constituting the active matrix device 1 will be sequentially described in detail.

The substrate 7 supports the respective layers (the respective portions) constituting the transistors 4 and 5.

For the substrate 7, for example, a glass substrate, a plastic substrate (resin substrate), a quartz substrate, a silicon substrate, a gallium-arsenic substrate, or the like may be used. When the flexible transistors 4 and 5 are provided, for the substrate 7, a resin substrate is selected.

An underlayer may be provided on the substrate 7. The underlayer is provided for the sake of preventing diffusion of ions from the surface of the substrate 7, improving adhesion (bonding property) of the source electrode 41 and the drain electrode 42 with respect to the substrate 7, and the like.

The underlayer may be formed of, for example, silicon oxide ($SiO_2$), silicon nitride (SiN), polyimide, polyamide, an insolubilized cross-linked polymer, or the like.

A plurality of transistors 4 and 5 are provided on one surface (upper surface) of the substrate 7.

The transistors 4 and 5 are top gate-type transistors. Since the transistors 4 and 5 have the same configuration, in the following description, the transistor 4 will be representatively described, and description of the transistor 5 will be omitted.

In the transistor 4, the source electrode 41 and the drain electrode 42 are provided on the substrate 7 to be separated from each other, and the semiconductor layer 43 is provided so as to come into contact with the source electrode 41 and the drain electrode 42. The gate insulator layer 44 is provided so as to come into contact with the upper surface (the surface opposite to the substrate 7) of the semiconductor layer 43. The gate electrode 45 is provided on the upper surface (the surface opposite to the semiconductor layer 43) of the gate insulator layer 44 so as to correspond to a region between the source electrode 41 and the drain electrode 42.

In the transistor 4, a region of the semiconductor layer 43 between the source electrode 41 and the drain electrode 42 forms a channel region through which carriers move. Most of the carriers induced into the channel region move along the interface of the semiconductor layer 43 and the gate insulator layer 44.

In the following description, in the channel region, the length of the movement direction of the carriers, that is, the distance between the source electrode 41 and the drain electrode 42 is referred to as a channel length, and the length in the direction orthogonal to the channel length direction is referred to as a channel width.

The source electrode 41 and the drain electrode 42 may be formed of, for example, metal materials, such as Pd, Pt, Au, W, Ta, Mo, Al, Cr, Ti, Cu, and alloys thereof. The materials are appropriately selected depending on the types of carriers which move through the channel region.

For example, in the case of a p-channel transistor in which holes as carriers move through the channel region, Pd, Pt, Au, Ni, or Cu having a comparatively large work function, or an alloy thereof may be used.

In addition to the metal materials, the source electrode 41 and the drain electrode 42 may be formed of, for example, conductive oxides, such as ITO, FTO, ATO, and $SnO_2$, carbon materials, such as carbon black, carbon nanotube, and fullerene, or conductive polymer materials, such as polyacetylene, polypyrrole, polythiophene (for example, PEDOT (poly-ethylenedioxythiophene)), polyaniline, poly(p-phenylene), poly(p-phenylenevinylene), polyfluorene, polycarbazole, polysilane, or derivatives thereof. These materials may be used alone, or two or more materials may be used in combination.

The conductive polymer materials are usually used in a state where a polymer, such as iron chloride, iodine, inorganic acid, organic acid, or polystyrene sulfonic acid, is doped, and conductivity is provided.

The average thickness of the source electrode 41 and the drain electrode 42 is not particularly limited, preferably, in a range of about 30 to 300 nm, and more preferably, in a range of about 50 to 150 nm.

The distance (separation distance) between the source electrode 41 and the drain electrode 42, that is, the channel length is preferably equal to or smaller than 100 μm, more preferably in a range of about 2 to 30 μm, and still more preferably in a range of about 5 to 20 μm. If the channel length is smaller than the lower limit value, a variation in the channel length may occur between a plurality of transistors and the characteristics (transistor characteristics) may vary. Meanwhile, if the channel length is larger than the upper limit value, then the absolute value of a threshold voltage may increase, the value of a drain current may decrease, and the characteristics of the transistors 4 may be insufficient.

The channel width is preferably in a range of about 0.1 to 5 mm, and more preferably in a range of about 0.2 to 2 mm. If the channel width is smaller than the lower limit value, then the value of the drain current may decrease, and the characteristics of the transistors 4 may be insufficient. Meanwhile, if the channel width is larger than the upper limit value, then the transistors 4 may increase in size, parasitic capacitance may increase, or a leakage current to the gate electrode 45 through the gate insulator layer 44 may increase.

The semiconductor layer 43 is provided on the surfaces of the source electrode 41 and the drain electrode 42 opposite to the substrate 7. It should suffice that the semiconductor layer 43 is provided at least between the source electrode 41 and the drain electrode 42.

The semiconductor layer 43 may be formed mainly of an inorganic semiconductor material or an organic semiconductor material (an organic material having a semiconductor electrical conduction property).

Examples of the inorganic semiconductor material include silicon, such as polycrystalline silicon or amorphous silicon, germanium, gallium arsenide, and the like.

Examples of the organic semiconductor material include low-molecular-weight organic semiconductor materials, such as naphthalene, anthracene, tetracene, pentacene, hexacene, perylene, hydrazone, triphenylmethane, diphenylmethane, stilbene, arylvinyl, pyrazoline, triphenylamine, triarylamine, oligothiophene, phthalocyanine, and derivatives thereof, and high-molecular-weight organic semiconductor materials (conjugated high-molecular-weight materials), such as poly-N-vinylcarbazole, polyvinylpyrene, polyvinylanthracene, polythiophene, polyhexylthiophene, polyalkylthiophene, poly(p-phenylenevinylene), polythienylenevinylene, polyarylamine, pyrene-formaldehyde resin, ethylcarbazole-formaldehyde resin, fluorene-bithiophene copolymer, fluorene-arylamine copolymer, and derivatives thereof. These materials may be used alone, or two or more materials may be used in combination. In particular, materials mainly containing high-molecular-weight organic semiconductor materials (conjugated high-molecular-weight materials) be used preferably. The conjugated high-molecular-weight materials have particularly high carrier mobility due to the specific spread of electron clouds.

The high-molecular-weight organic semiconductor materials are preferably used because a film can be easily formed by a simple method and comparatively easily aligned. In particular, of these materials, as a high-molecular-weight organic semiconductor material (conjugated high-molecular-weight material), a material containing at least one of fluorene-bithiophene copolymer, fluorene-arylamine copolymer, polyarylamine, and derivatives thereof is preferably used because it is hard for the material to be oxidized in air and the material is stable.

The semiconductor layer 43 formed mainly of a high-molecular-weight organic semiconductor material can be reduced in thickness and weight, and has excellent flexibility, such that the semiconductor layer 43 can be applied to a transistor which is used as a switching element of a flexible display.

The average thickness of the semiconductor layer is preferably in a range of about 1 to 200 nm, and more preferably in a range of 10 to 100 nm.

The gate insulator layer 44 is provided on the semiconductor layer 43 (the surface of the semiconductor layer 43 opposite to the substrate 7) so as to cover the source electrode 41, the drain electrode 42, and the semiconductor layer 43.

The gate insulator layer 44 insulates the gate electrode 45 from the source electrode 41 and the drain electrode 42.

In this embodiment, the gate insulator layer 44 is uniformly formed in the substantially entire region of the substrate 7 (upper surface) excluding part of the respective connection electrodes 8. It should be noted that the gate insulator layer 44 may be partially provided in the region of the substrate 7 excluding part of the respective connection electrodes 8 insofar as the gate electrode 45 can be insulated from the source electrode 41 and the drain electrode 42.

As the material for the gate insulator layer 44, any known gate insulating material may be used without being particularly limited. For example, an organic material or an inorganic material may be used.

Examples of the organic material include polymethyl methacrylate, polyvinyl phenol, polyimide, polystyrene, polyvinyl alcohol, and polyvinyl acetate. These materials may be used alone, or two or more materials may be used in combination.

Examples of the inorganic materials include metal oxides, such as silica, silicon nitride, aluminum oxide, and tantalum oxide, and metal composite oxides, such as barium-strontium titanate and lead zirconium titanate. These materials may be used alone, or two or more materials may be used in combination.

The thickness (average) of the gate insulator layer 44 is not particularly limited, and preferably in a range of about 10 to 5000 nm, more preferably, in a range of about 50 to 1000 nm. The thickness of the gate insulator layer 44 is within the above-described range, such that the gate electrode 45 can be reliably insulated from the source electrode 41 and the drain electrode 42, and the operation voltage of the transistor 4 can be reduced.

The gate insulator layer 44 is not limited to a single-layered structure, and the gate insulator layer 44 may have a multi-layer structure.

The gate electrode 45 is provided on the gate insulator layer 44 (the surface of the gate insulator layer 44 opposite to the semiconductor layer 43).

In particular, the gate electrode 45 is provided on the gate insulator layer 44 around the bottom of a corresponding through portion 91 of the insulator layer 9 described below.

As the material for the gate electrode 45, the same materials as the materials for the source electrode 41 and the drain electrode 42 may be used.

The average thickness of gate electrode 45 is not particularly limited, and preferably in a range of about 0.1 to 5000 nm, more preferably, in a range of about 1 to 5000 nm, still more preferably, in a range of about 10 to 5000 nm.

The gate electrode 45 may be porous. Thus, the gate electrode 45 has a high aeration property. As a result, even when the transistor 4 is temporarily exposed to the environment of high temperature and humidity, when the transistor 4 returns to the environment of low temperature and humidity, oxygen or moisture infiltrated into the transistor 4 is rapidly discharged to outside of the transistor 4. For this reason, oxygen or moisture can be prevented from being retained in the transistor 4, and the characteristics of the transistor 4 can be appropriately maintained.

It should be noted that such a structure may be applied to the source electrode 41 and the drain electrode 42.

The insulator layer 9 is provided on the gate insulator layer 44 (the surface of the gate insulator layer 44 opposite to the semiconductor layer 43).

The insulator layer 9 is provided with through portions 91 which pass through the insulator layer 9 in the thickness direction to correspond to the gate electrodes 45 and the second wiring lines 3 in plan view. Thus, the insulator layer 9 is provided with a plurality of land portions 92. A plurality of land portions 92 have a shape corresponding to a plurality of pixel electrodes 6 in plan view. Of these portions, adjacent portions in the left-right direction of FIG. 1 are connected to each other.

The edge of an opening of each through portion 91 is located inside the edge of the bottom of the through portion 91 in plan view. Specifically, the through portions 91 are formed with an increasing width (inner diameter) from the opening (the upper side of FIG. 2) toward the bottom (the lower side of FIG. 2) (so as to have an inversely tapered shape). That is, the through portions 91 are formed with an increasing width from the pixel electrode 6 side toward the gate insulator layer 44 side in transverse sectional view (with a gradually increasing width). Thus, it is hard for an electrode material to be stuck to the wall of each of the through portions 91, such that the pixel electrode 6 and the gate electrode 45 can be prevented from being short-circuited. As a result, reliability of the active matrix device 1 can be improved. The through portions 91 have an inversely tapered shape, such that the pixel electrode 6 can have a large area, and the aperture ratio of the active matrix device 1 can be increased.

Although in this embodiment, the through portions 91 are formed with an increasing width from the opening toward the bottom over the entire region in the depth direction, the through portions 91 may be formed such that a portion is formed with an increasing width from the opening toward the bottom in at least a partial range in the depth direction, and a portion is formed with a constant or decreasing width in a range other than the portion with an increasing width. In this case, the portion with an increasing width is preferably formed in the vicinity of the opening of the relevant through portion 91. Thus, the above-described effects (short-circuit prevention and aperture ratio improvement) can be prominent. Although in this embodiment, the portion with an increasing width is formed such that the width increases continuously, the portion with an increasing width may be formed such that the width increases in a stepwise manner, for example, in one step or in multiple steps.

The insulator layer 9 having the through portions 91 functions as a mask when, in a third step of a manufacturing process described below, the gate electrode 45 is formed by vapor film formation.

If the insulator layer 9 is used as a mask, a film formation material (electrode material) can be prevented from being stuck to the walls of the through portions 91 having an inversely tapered shape. For this reason, the gate electrodes 45 and the electrodes 6A can be formed to be separated from each other only by single vapor film formation. As a result, productivity of the active matrix device 1 can be improved.

As the material for the insulator layer 9, a material which has an insulation property and is suitable for forming the through portions 91 may be used. The same material as the material for the gate insulator layer 44 may be used, but a photoresist material is preferably used. Thus, the through portions 91 having an inversely tapered shape can be formed simply and accurately.

A plurality of pixel electrodes 6 are provided on the surface of the insulator layer 9 (specifically, the respective land portions 92) opposite to the gate insulator layer 44.

A plurality of pixel electrodes 6 provided on the insulator layer 9 form one kind of electrodes, to which a voltage for driving each pixel is applied, in constructing an electrophoretic display device 20 by using the active matrix device 1, as described below.

Examples of the material for the pixel electrodes 6 include metals, such as Ni, Pd, Pt, Li, Mg, Ca, Sr, La, Ce, Er, Eu, Sc, Y, Yb, Ag, Cu, Co, Al, Cs, and Rb, alloys thereof, such as MgAg, AlLi, and CuLi, and oxides, such as ITO (Indium Tin Oxide), $SfO_2$, Sb-contained $SnO_2$, and Al-contained ZnO. These materials may be used alone, or two or more materials may be used in combination.

Each of the pixel electrodes 6 is electrically connected to the drain electrode 42 of the corresponding transistor 4 through a conductor portion 10. The conductor portion 10 is provided so as to pass through the gate insulator layer 44 and the insulator layer 9 in the thickness direction.

In the transistor 4, a voltage applied to the gate electrode 45 is changed to control the amount of current flowing between the source electrode 41 and the drain electrode 42.

That is, in an OFF state where no voltage is applied to the gate electrode 45, even when a voltage is applied between the source electrode 41 and the drain electrode 42, there is little carrier in the semiconductor layer 43, such that only a minimal current flows. Meanwhile, in an ON state where a voltage is applied to the gate electrode 45, movable charges (carriers) are induced to a portion of the semiconductor layer 43 facing the gate insulator layer 44, and a flow channel is formed in the channel region between the source electrode 41 and the drain electrode 42. In this state, if a voltage is applied between the source electrode 41 and the drain electrode 42, a current flows through the channel region.

According to the active matrix device 1 configured as above, the gate electrode 45 is formed on the gate insulator layer 44 around the bottom of the corresponding through portion 91, and the pixel electrode 6 is formed on the insulator layer 9 in the vicinity of the through portion 91. Therefore, the active matrix device can be manufactured with excellent productivity by using a manufacturing method described below.

Manufacturing Method of Active Matrix Device

Next, a manufacturing method of the active matrix device 1 which is an example of a method of manufacturing an active matrix device according to an embodiment of the invention will be described.

Figure 3A:
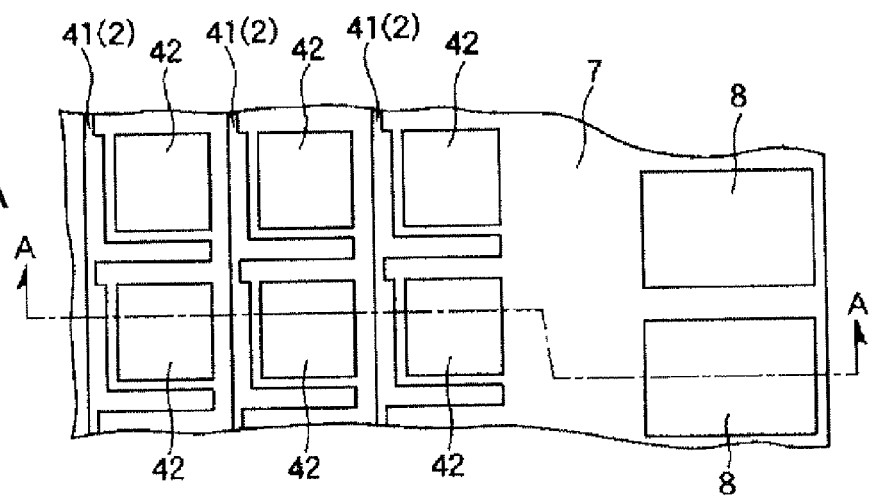
FIGS. 3A and 3B are diagrams illustrating a step of forming source electrodes and drain electrodes in a manufacturing method of the active matrix device shown in FIG. 1.
Figure 3B:
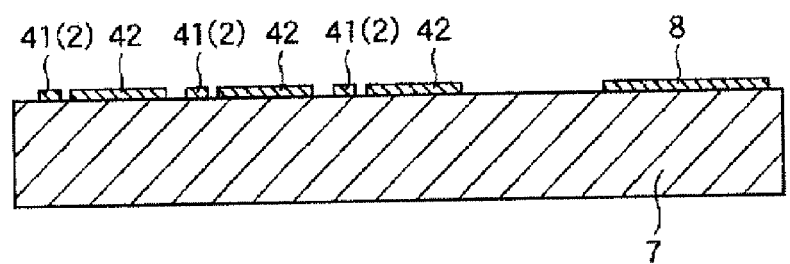
Figure 4A:
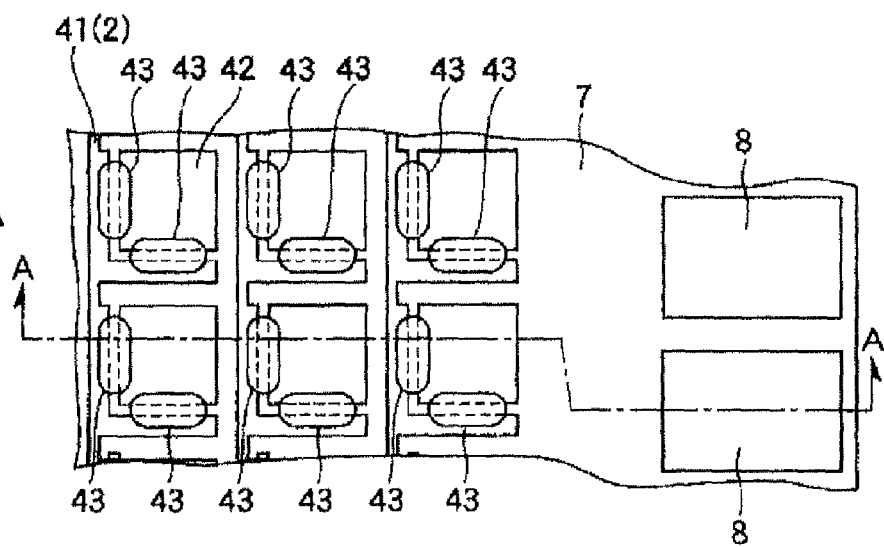
FIGS. 4A and 4B are diagrams illustrating a step of forming a semiconductor layer in the manufacturing method of the active matrix device shown in FIG. 1.
Figure 4B:
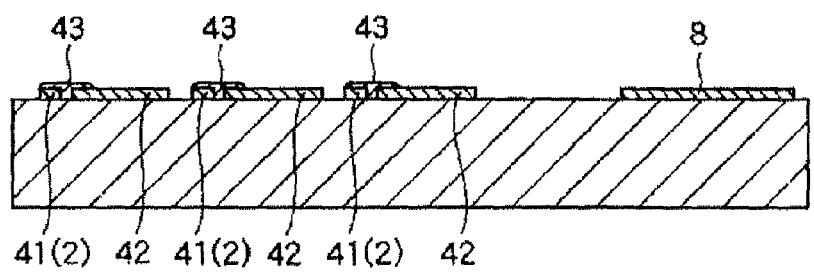
Figure 5A:
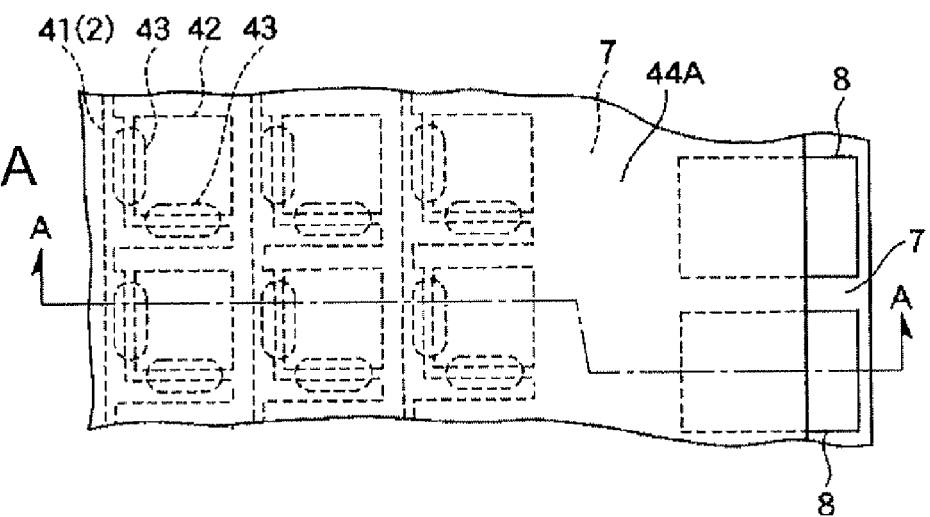
FIGS. 5A and 5B are diagrams illustrating a step of forming a gate insulator layer in the manufacturing method of the active matrix device shown in FIG. 1.
Figure 5B:
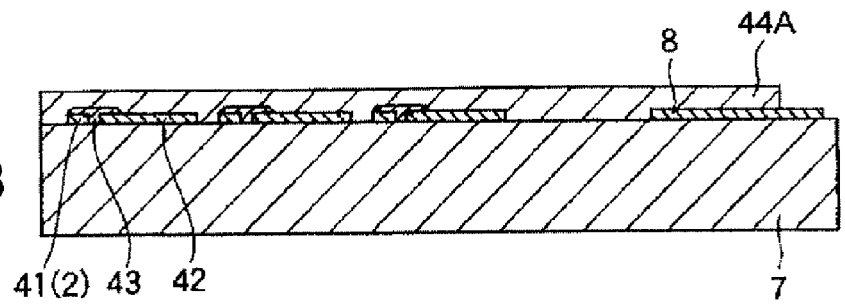
Figure 7A:
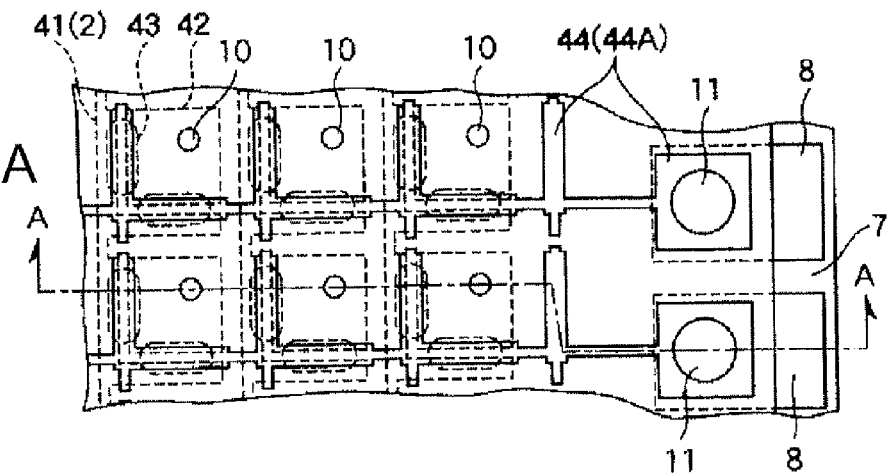
FIGS. 7A and 7B are diagrams illustrating a step of forming conductor portions in the manufacturing method of the active matrix device shown in FIG. 1.
Figure 7B:
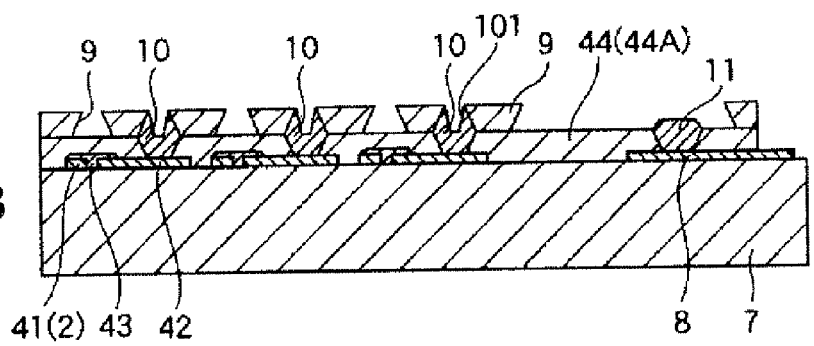
Figure 8A:
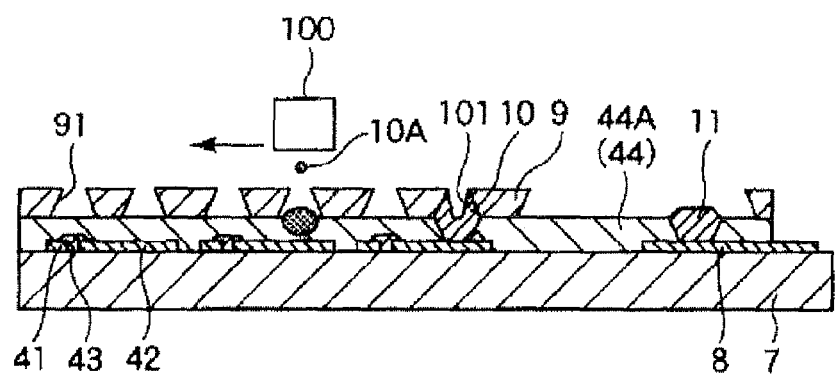
FIGS. 8A and 8B are diagrams illustrating the step of forming conductor portions shown in FIGS. 7A and 7B.
Figure 8B:
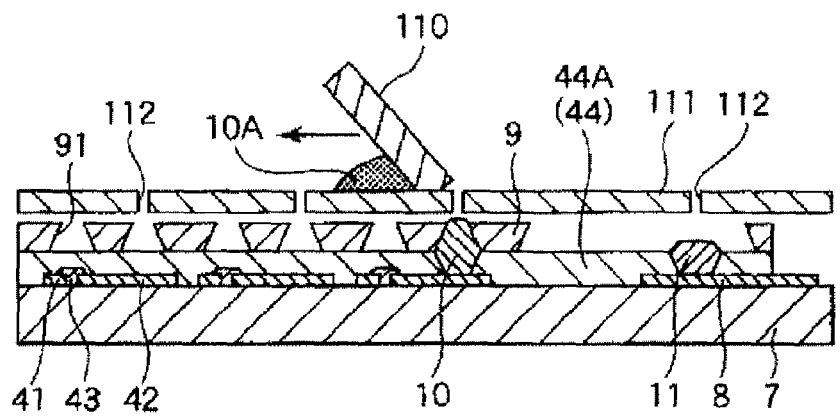
Figure 9:
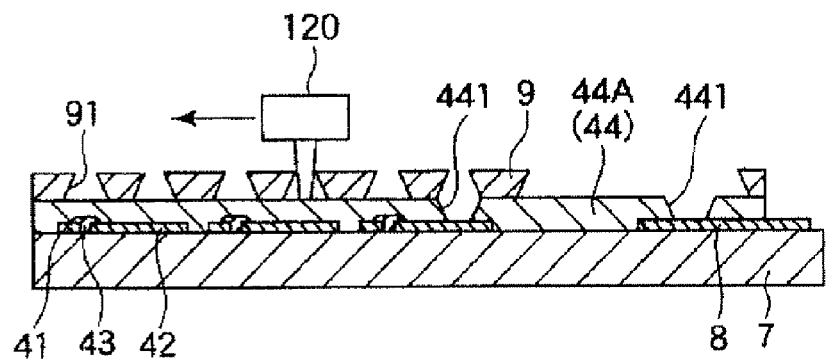
FIG. 9 is a diagram illustrating the step of forming conductor portions shown in FIGS. 7A and 7B.
Figure 10A:
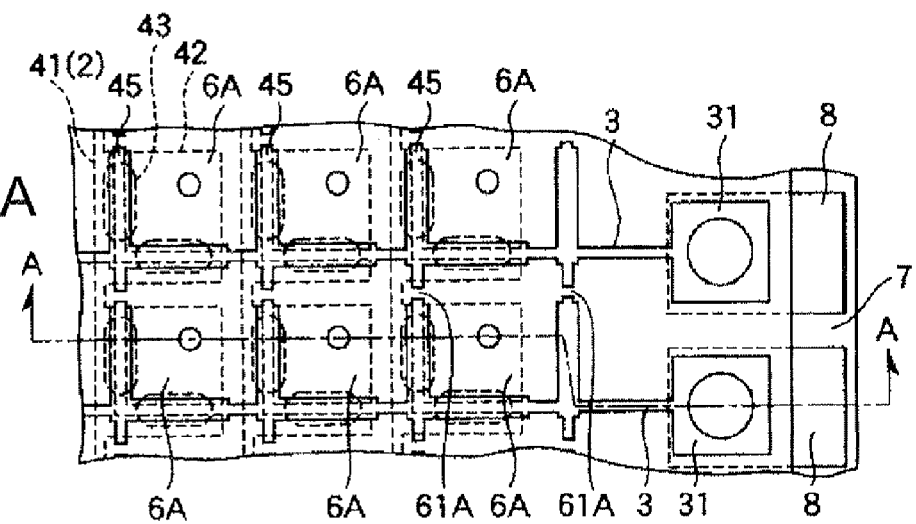
FIGS. 10A and 10B are diagrams illustrating a step of forming gate electrodes and pixel electrodes in the manufacturing method of the active matrix device shown in FIG. 1.
Figure 10B:
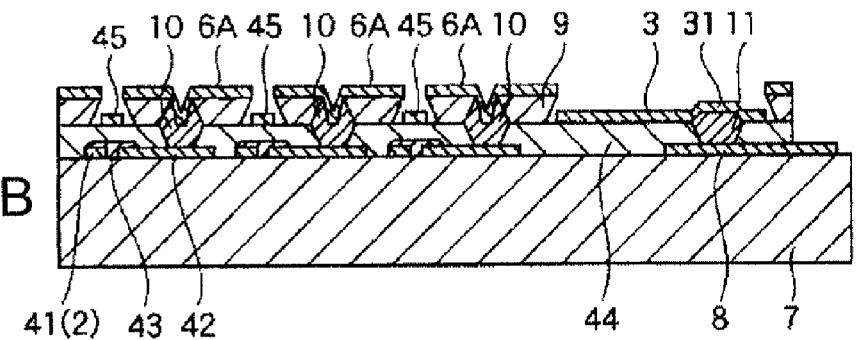
Figure 11:
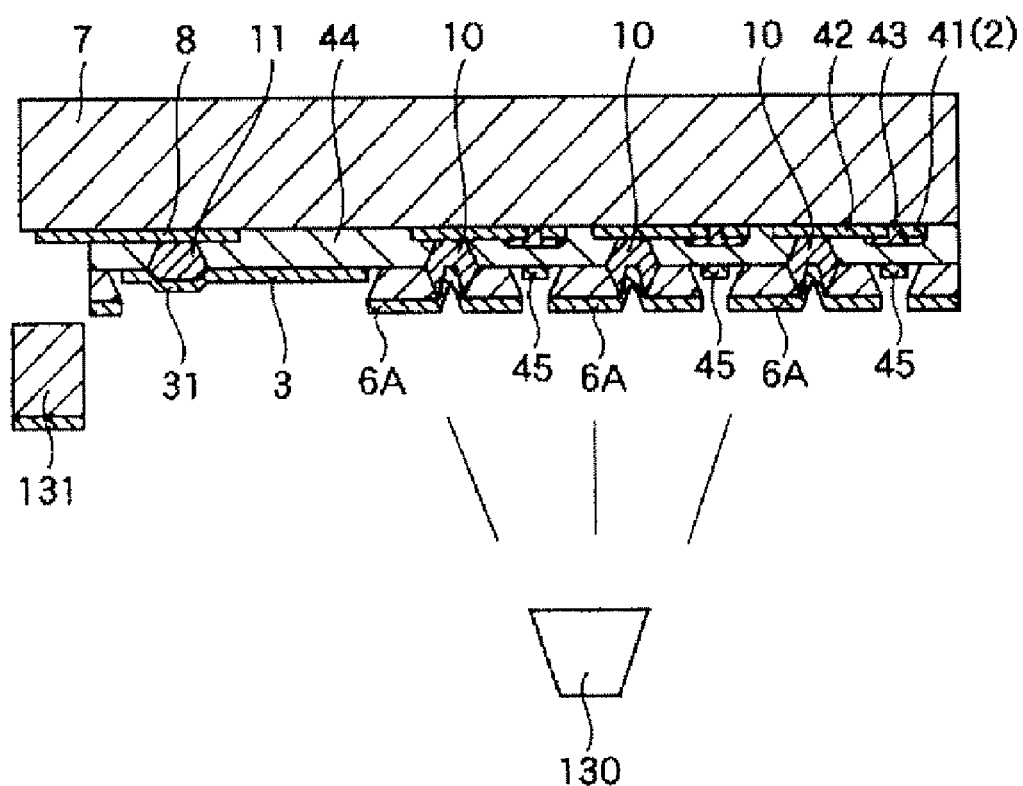
FIG. 11 is a diagram illustrating the step of forming gate electrodes and pixel electrodes shown in FIGS. 10A and 10B.
Figure 12A:
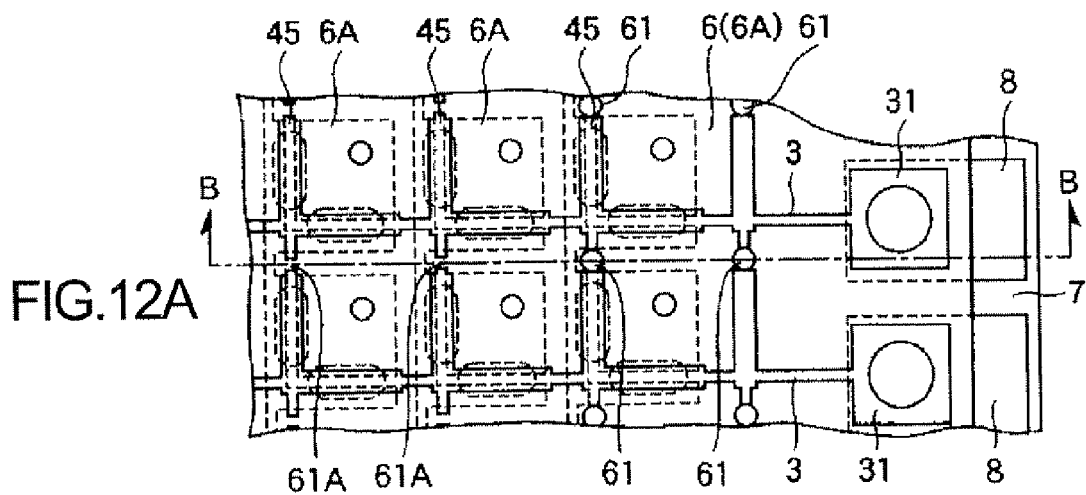
FIGS. 12A and 12B are diagrams illustrating the step of forming gate electrodes and pixel electrodes shown in FIGS. 10A and 10B.
Figure 12B:
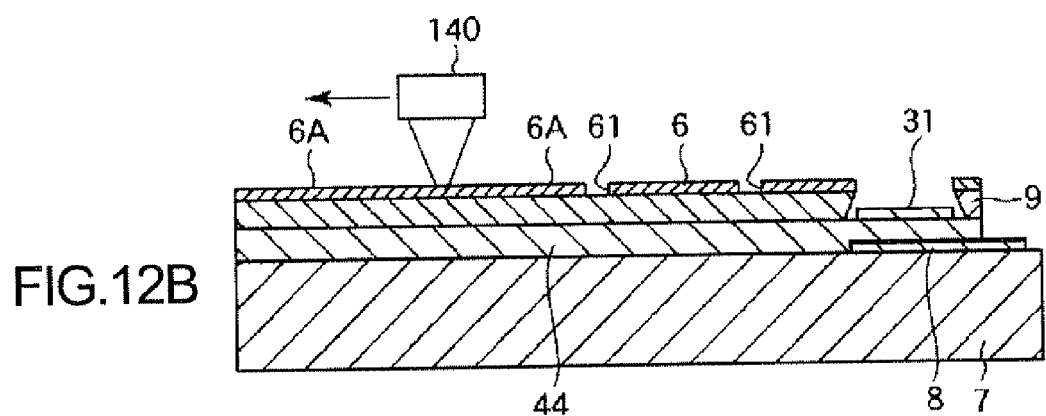
Figure 13:
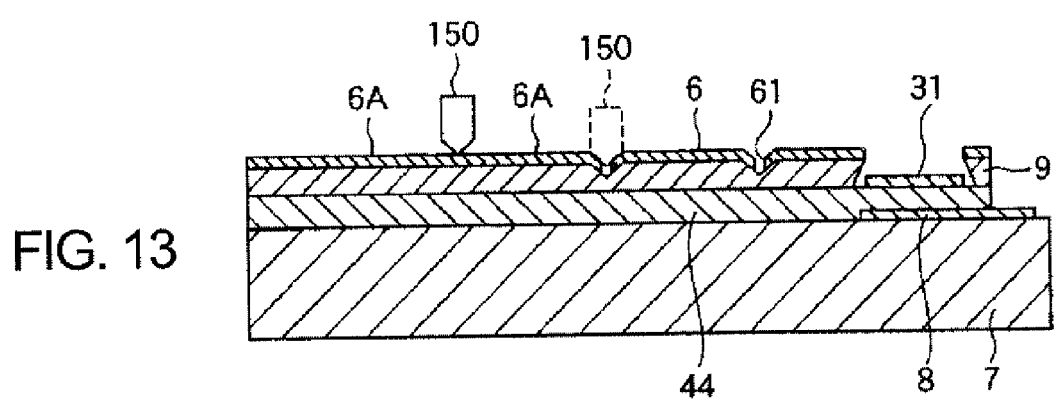
FIG. 13 is a diagram illustrating another example of the step shown in FIGS. 12A and 12B.
Figure 14A:
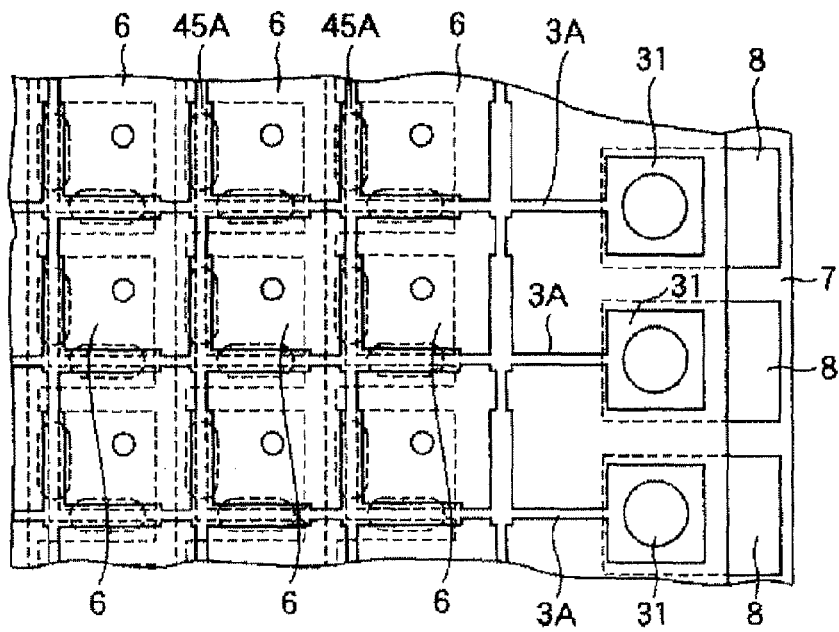
FIGS. 14A and 14B are diagrams illustrating another example of the manufacturing method of the active matrix device shown in FIG. 1.
Figure 14B:
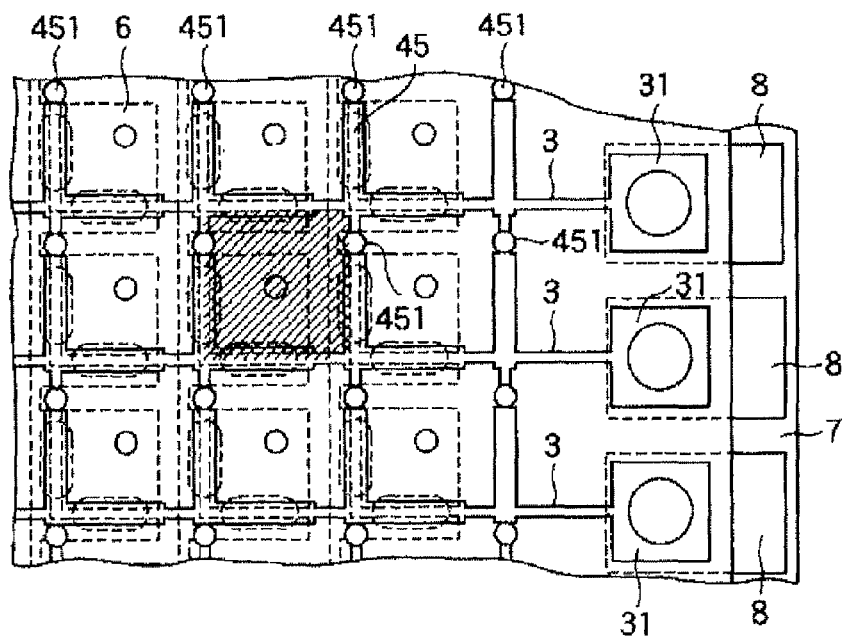
Figure 15:
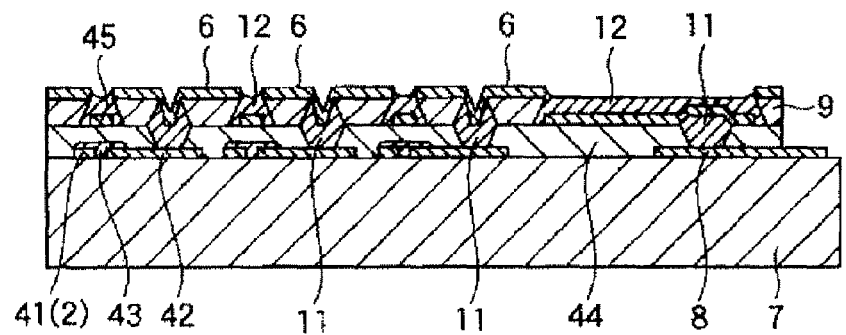
FIG. 15 is a diagram illustrating another example of the manufacturing method of the active matrix device shown in FIG. 1.

FIGS. 3A and 3B are diagrams illustrating a step of forming source electrodes and drain electrodes in a manufacturing method of the active matrix device shown in FIG. 1. FIGS. 4A and 4B are diagrams illustrating a step of forming a semiconductor layer in the manufacturing method of the active matrix device shown in FIG. 1. FIGS. 5A and 5B are diagrams illustrating a step of forming a gate insulator layer in the manufacturing method of the active matrix device shown in FIG. 1. FIGS. 6A and 6B are diagrams illustrating a step of forming an insulator layer in the manufacturing method of the active matrix device shown in FIG. 1. FIGS. 7A and 7B are diagrams illustrating a step of forming conductor portions in the manufacturing method of the active matrix device shown in FIG. 1. FIGS. 8A and 8B are diagrams illustrating the step of forming conductor portions shown in FIGS. 7A and 7B. FIG. 9 is a diagram showing the step of forming conductor portions shown in FIGS. 7A and 7B. FIGS. 10A and 10B are diagrams illustrating a step of forming gate electrodes and pixel electrodes in the manufacturing method of the active matrix device shown in FIG. 1. FIG. 11 is a diagram illustrating the step of forming gate electrodes and pixel electrodes shown in FIGS. 10A and 10B. FIGS. 12A and 12B are diagrams illustrating the step of forming gate electrodes and pixel electrodes shown in FIGS. 10A and 10B. FIG. 13 is a diagram illustrating another example of the step shown in FIGS. 12A and 12B. FIGS. 14A and 14B are diagrams illustrating another example of the manufacturing method of the active matrix device shown in FIG. 1. FIG. 15 is a diagram illustrating another example of the manufacturing method of the active matrix device shown in FIG. 1.

FIGS. 3A to 7A and 10A are plan views, and FIGS. 3B to 7B and 10B are sectional views taken along the line A-A of FIGS. 3A to 7A and 10A, respectively. FIG. 12A is a plan view, and FIG. 12B is a sectional view taken along the line B-B of FIG. 12A.

The manufacturing method of the active matrix device 1 includes [A] a step of forming the source electrodes 41, the drain electrode 42, the semiconductor layer 43, and the gate insulator layer 44 (first step), [B] a step of forming the insulator layer 9 (second step), [C] a step of forming the conductor portions 10, and [D] a step of forming the gate electrodes 45 and the pixel electrodes 6 (third step).

Hereinafter, the respective steps will be sequentially described in detail.

A. First Step

The step [A] has <A1> a step of forming the source electrodes 41 and the drain electrodes 42, <A2> a step of forming the semiconductor layer 43, and <A3> a step of forming the gate insulator layer 44.

<A1>

First, the substrate 7 is prepared, and as shown in FIGS. 3A and 3B, source electrodes 41 (first wiring lines 2) and drain electrodes 42 are formed on one surface of the substrate 7.

At this time, a connection electrode 8 is formed at the same time the source electrodes 41 and the drain electrodes 42 are formed.

The formation of the connection electrode 8 is the same as the formation of the source electrodes 41 and the drain electrode 42, and thus description thereof will be omitted.

Specifically, for example, when the source electrode 41 and the drain electrode 42 are formed mainly of metals, first, a metal film (metal layer) is formed on the substrate 7.

The metal film may be formed by, for example, a chemical deposition method (CVD), such as plasma CVD, thermal CVD, or laser CVD, a dry plating method, such as vacuum deposition, sputtering (low-temperature sputtering), or ion plating, a wet plating method, such as electroplating, dip plating, or electroless plating, a spraying method, a sol-gel method, an MOD method, or bonding of a metal foil.

A resist layer is formed on the metal film by photolithography to have a shape corresponding to the shapes of the source electrodes 41 and the drain electrodes 42, and the like. An unnecessary portion of the metal film is removed with the resist layer as a mask.

In removing the metal film, for example, one of a physical etching method, such as plasma etching, reactive ion etching, beam etching, or optically assisted etching, and a chemical etching method, such as wet etching, may be used, or two or more methods may be used in combination.

Thereafter, the resist layer is removed, such that, as shown in FIGS. 3A and 3B, the source electrodes 41 and the drain electrodes 42 are obtained.

The source electrodes 41 and the drain electrodes 42 may be formed by, for example, supplying a liquid material, such as a colloid liquid (dispersion liquid) containing conductive particles, or a liquid (solution or dispersion liquid) containing a conductive polymer onto the substrate 7 to form a film and, if necessary, performing post-treatment (for example, heating, irradiation of infrared rays, application of ultrasonic waves, or the like) on the film.

Prior to progressing to the next step <A2>, in particular, the source electrodes 41 and the drain electrodes 42 are preferably subjected to the post-treatment.

For example, when the source electrodes 41 and the drain electrodes 42 are formed mainly of metal materials, plasma treatment (for example, argon plasma treatment or oxygen plasma treatment) is preferably performed. Thus, an organic substance stuck to the surfaces of the source electrodes 41 and the drain electrodes 42 can be removed, and as a result, the characteristics of the resultant transistors 4 can be further improved. In the step <A2> described below, when a liquid material containing an organic semiconductor material or a precursor thereof falls in droplets and is hardened to form the semiconductor layer 43, a resistant behavior of the liquid material falling in droplets can be controlled.

In particular, when the source electrodes 41 and the drain electrodes 42, and the like are formed mainly of Ni and Cu, oxygen plasma treatment is suitably performed. Thus, an organic substance stuck to the surfaces of the source electrodes 41 and the drain electrodes 42, and the like can be removed, the vicinity of the surfaces can be oxidized, and the work function can be increased. As a result, in constructing the p-channel transistors 4, excellent characteristics are achieved.

A2

Next, as shown in FIGS. 4A and 4B, a semiconductor layer 43 is formed.

When an organic semiconductor material is used, the semiconductor layer 43 may be formed by, for example, coating (supplying) a solution containing an organic semiconductor material or a precursor thereof between or in the vicinity of the source electrodes 41 and the drain electrode 42 and, if necessary, performing post-treatment (for example, heating, irradiation of infrared rays, application of ultrasonic waves, or the like) on the coated film.

As the method of coating (supplying) a solution containing an organic semiconductor material or a precursor thereof, a coating method, a printing method (an ink jet method, a screen printing method, or the like), or the like may be used.

The semiconductor layer 43 may be formed by mask deposition.

A3

Next, as shown in FIGS. 5A and 5B, the gate insulator layer 44A is formed.

The gate insulator layer 44A forms the gate insulator layer 44 in the step [C] described below, and is the same as the gate insulator layer 44, except that through holes are not formed into which conductor portions 10 and 11 are inserted.

When an organic insulating material is used, the gate insulator layer 44A may be formed by, for example, coating (supplying) a solution containing an organic insulating material or a precursor thereof so as to cover the semiconductor layer 43 and, if necessary, performing post-treatment (for example, heating, irradiation of infrared rays, application of ultrasonic waves, or the like) on the coated film.

As the method of coating (supplying) a solution containing an organic insulating material or a precursor thereof onto the semiconductor layer 43, a coating method, a printing method, or the like may be used.

When the gate insulator layer 44A is formed of an inorganic material, the gate insulator layer 44A may be formed by, for example, a thermal oxidization method, a CVD method, an SCG method, or the like. If polysilazane is used as a raw material, as the gate insulator layer 44A, a silica film or a silicon nitride film may be formed by a wet process.

In particular, the gate insulator layer 44A is preferably formed of an organic insulating material, and more preferably formed of a high-molecular-weight material. Thus, in the step [C] described below, when the conductor portions 10 and 11 are formed of a liquid material, a liquid material in which a high-molecular-material can be dissolved is used. The resultant liquid material is applied to the gate insulator layer 44A, such that the through holes for the conductor portions 10 and 11 can be formed in the gate insulator layer 44A.

B. Second Step

Next, as shown in FIGS. 6A and 6B, an insulator layer 9 is formed.

At this time, the insulator layer 9 is provided with through portions 91 corresponding to the gate electrodes 45 (second wiring lines 3). The insulator layer 9 is also provided with through portions 93 which are formed at the portions where the conductor portions 10 are to be formed so as to pass through the insulator layer 9 in the thickness direction.

As described above, the through portions 91 and are formed with an increasing width from the upper side of FIG. 63 toward the lower side. For this reason, in the step [D] described below, the gate electrodes 45 and the pixel electrodes 6 which are separated from each other can be collectively formed by a vapor film deposition method.

As the method of forming the insulator layer 9, any method may be used without being particularly limited insofar as the insulator layer 9 having the inversely tapered through portions 91 can be formed. For example, photolithography is suitably used.

Specifically, a photoresist material (for example, ZPN2464 manufactured by Zeon Corporation or the like) is coated onto the gate insulator layer 44A, and exposure and development are carried out to form the insulator layer 9 having the through portions 91. As the photoresist material, any one of a positive type and a negative type may be used.

As a light source for the exposure, various light sources may be used without being particularly limited insofar as the through portions 91 having an inversely tapered sectional shape described above can be formed. For example, a surface light source or a point light source may be used.

At the time of the exposure, light from the light source can be selectively irradiated onto the coated photoresist material through a mask.

At the time of the exposure, light from the light source may be selectively irradiated onto the coated photoresist material while scanning light. In this case, the outgoing direction of light from the light source is inclined with respect to the insulator layer 9, the through portions 91 having an inversely tapered sectional shape described above can be formed comparatively simply.

At the time of the exposure, light from the light source may be irradiated onto the coated photoresist material through an optical system, such as a lens. In this case, the focusing point of light by the optical system is shifted with respect to the insulator layer 9 in the thickness direction, such that the through portions 91 having an inversely tapered sectional shape described above can be formed comparatively simply.

C

Next, as shown in FIGS. 7A and 7B, conductor portions 10 are formed. At this time, the conductor portions 10 pass through the insulator layer 9 and the gate insulator layer 44A in the thickness direction and provide electric conduction to the drain electrodes 42.

The step [C] is carried out after the second step [B] and before the third step [D], such that, in the third step [D] described below, the pixel electrodes 6 and the drain electrodes 42 can be electrically connected to each other through the conductor portions 10. Thus, even when the gate insulator layer 44A is present between the drain electrodes 42 and the pixel electrodes 6, electrical conduction can be provided between the drain electrodes 42 and the pixel electrodes 6.

At this time, conductor portions 11 are formed in the same manner as the conductor portions 10.

The method of forming the conductor portions 10 is not particularly limited, and a printing method (an ink jet method, a screen printing method, or the like) is suitably used.

That is, in the step [C] of forming the conductor portions 10, preferably, a liquid material containing a conductive material is applied and hardened or solidified to form the conductor portions 10. Thus, the conductor portions 10 can be formed comparatively simply and reliably to have a desired dimension at desired positions with high accuracy.

When the conductor portions 10 and 11 are formed by a printing method, for example, a liquid material, such as a colloid liquid (dispersion liquid) containing conductive particles (conductive material), such as Ag or carbon black, or a liquid material (solution or dispersion liquid) containing a conductive polymer (conductive material) is supplied onto the gate insulator layer 44A and, if necessary, post-treatment (for example, heating, irradiation of infrared rays, application of ultrasonic waves, or the like) is performed.

In this embodiment, the liquid material can dissolve the gate insulator layer 44A (exhibits solubility to the gate insulator layer 44A).

Thus, the liquid material is applied to the gate insulator layer 44A, such that through holes for the conductor portions 10 and 11 can be formed in the gate insulator layer 44A. As a result, a step of punching holes in advance at the portions of the gate insulator layer 44A, at which the conductor portions 10 are to be formed, prior to applying the liquid material is not required, such that the manufacturing process of the active matrix device 1 (semiconductor device) can be simplified, and productivity can be increased.

Specifically, when the liquid material is applied onto the gate insulator layer 44 by an ink jet method (liquid droplet ejection method), as shown in FIG. 8A, the liquid droplets of a liquid material 10A are applied from an ink jet head (liquid droplet ejection head) 100 onto predetermined portions of the gate insulator layer 44.

According to the ink jet method, a predetermined amount of liquid droplets can fall in droplets easily and accurately.

The liquid material 10A contains a solvent or a dispersion medium.

The solvent or dispersion medium is determined depending on the type of conductive particles or conductive polymer or the dropping conditions, and is not particularly limited. Examples of the solvent or dispersion medium include inorganic solvents, such as acetate, sulfate, ammonia, hydrogen peroxide, water, carbon bisulfide, carbon tetrachloride, and ethylene carbonate, and various organic solvents, such as ketone-based solvents, such as methyl ethyl ketone (MEK), acetone, diethyl ketone, methyl isobutyl ketone (MIRK), methyl isopropyl ketone (MIPK), and cyclohexanone, alcohol-based solvents, such as methanol, ethanol, isopropanol, ethylene glycol, diethylene golycol (DEG), and glycerol, ether-based solvents, such as diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (carbitol), cellosolve-based solvents, such as methyl cellosolve, ethyl cellosolve, and phenyl cellosolve, aliphatic hydrocarbon-based solvents, such as hexane, pentane, heptane, and cyclohexane, aromatic hydrocarbon-based solvents, such as toluene, xylene, and benzene, aromatic heterocyclic compound-based solvents, such as pyridine, pyrazine, furan, pyrrole, thiophene, and methylpyrrolidone, amide-based solvents, such as N,N-dimethylformamide (DMF) and N,N-dimethylacetamide (DMA), halogen compound-based solvents, such as dichloromethane, chloroform, and 1,2-dichloroethane, ester-based solvents, such as ethyl acetate, methyl acetate, butyl acetate, isobutyl acetate, and ethyl formate, sulfur compound-based solvents, such as dimethyl sulfoxide (DMSO) and sulfolane, nitrile-based solvents, such as acetonitrile, propionitrile, and acrylonitrile, organic acid-based solvents, such as formic acid, acetic acid, trichloroacetic acid, trifluoroacetic acid, and mixed solvents containing these solvents.

Of these, when the gate insulator layer 44A is formed of a high-molecular-weight material (organic material) and the liquid material 10A exhibits solubility to the gate insulator layer 44A, as the solvent or dispersion medium, an ester-based solvent, such as butyl acetate or isobutyl acetate, is suitably used.

The viscosity (normal temperature) of the liquid material 10A is not particularly limited, preferably in a range of about 2 to 20 cps, and more preferably in a range of about 4 to 8 cps. If the viscosity of the liquid material 10A is within the above-described range, the liquid droplets can be ejected stably from the nozzles. When the viscosity of the liquid material 10A is smaller than the above-described range, vibration of a piezoelectric which is displaced at the time of ejection is hard to be attenuated, and ejection tends to be easily unstable. When the viscosity of the liquid material 10A is larger than the above-described range, flow channel resistance of the liquid material 10A is large. For this reason, at the time of high-speed printing, the liquid material 10A is not smoothly supplied, and thus ejection may be unstable.

The viscosity of the liquid material 10A can be adjusted by, for example, appropriately setting the concentration of the conductive particles or conductive polymer, the type or composition of the solvent or dispersion medium, or the like.

The size (average) of one droplet of the liquid material 10A is determined depending on the shape or area of the respective conductor portions 10 and 11. The size of one droplet of the liquid material 10A is not particularly limited, preferably in a range of about 0.1 to 40 pL, and more preferably in a range of about 1 to 30 pL. When the amount (average) of one droplet of the liquid material 10A is within the above-described range, a more accurate shape can be formed. When the volume of the droplets is excessively small, the liquid material 10A is hard to be stably ejected from the nozzles in accordance with the type of liquid material 10A. If the volume of the droplets is excessively large, the liquid material 10A is hard to fall in droplets so as to be within the application areas in accordance with the area or shape of the application areas.

The number of droplets falling in droplets may be one droplet or multiple droplets.

When the liquid material is applied onto the gate insulator layer 44 by a screen printing method, as shown in FIG. 8B, the liquid material is supplied onto a screen 111 having openings 112 corresponding to the predetermined portions of the gate insulator layer 44. Then, the liquid material 10A is moved along the screen 111 while being pressed against the screen 111 by a squeeze (plate-shaped member) 110, such that the liquid material 10A is pushed out from the openings 112 and supplied to the predetermined portions of the gate insulator layer 44A.

Prior to applying the liquid material 10A, punching may be carried out in advance at the portions of the gate insulator layer 44A where the conductor portions 10 and 11 are to be formed.

In this case, for example, as shown in FIG. 9, laser light is irradiated from a laser 120, such that through holes 441 are formed in the gate insulator layer 44A to correspond to the portions where the conductor portions 10 and 11 are to be formed. Thus, even when the liquid material 10A exhibits no solubility to the gate insulator layer 44A, the conductor portions 10 and 11 can be formed. Further, even when the liquid material 10A exhibits solubility to the gate insulator layer 44A, the through holes 441 are formed in advance, such that the amount of the liquid material 10A to be applied can be increased. Then, even when the liquid material 10A is dried/solidified and contracts, the conductor portions 10 and 11 having desired sizes can be formed.

In the step of forming the conductor portions 10, a decrease in volume occurs due to the liquid material 10A being hardened or solidified, and a concave portion 101 is formed at the end surface of each conductor portion 10 facing the insulator layer 9 (the side on which the pixel electrode 6 is formed) due to the decrease in volume (see FIGS. 7A, 7B, and 8A). The conductor portions 10 are preferably formed such that the concave portion 101 is widened from the gate insulator layer 44 side toward the corresponding pixel electrode 6 side. For example, the amount or concentration of the liquid material 10A to be supplied is adjusted such that the concave portion 101 is widened from the gate insulator layer 44 side toward the corresponding pixel electrode 6 side.

Thus, in the step [D] described below, when vapor film deposition is carried out, a conductor film (pixel electrode 6) can be prevented from being disconnected from the corresponding conductor portion 10 at the end of the insulator layer 9 and on the insulator layer 9. For this reason, the conductor portions 10 and the pixel electrodes 6 can be electrically connected to each other simply and reliably.

D. Third Step

Next, gate electrodes 45 and pixel electrodes 6 are formed.

Specifically, the step [D] has <D1> a step of forming the gate electrodes 45 (electrodes) on the gate insulator layer 44 and forming electrodes (conductor layer) 6A, which should become a plurality of pixel electrodes 6, on the insulator layer 9, and <D2> a step of forming a plurality of pixel electrodes 6 by using the electrodes 6A,

D1

First, as shown in FIGS. 10A and 10B, by a vapor film deposition method, the gate electrodes 45 (electrodes) are formed on the gate insulator layer 44, and the electrodes (conductive layers) 6A which should become a plurality of pixel electrodes 6 are formed on the insulator layer 9.

The electrodes 6A have a shape in plan view corresponding to the land portions 92. That is, the electrodes 6A have a shape such that adjacent pixel electrodes 6 in the left-right direction of FIGS. 10A and 10B are connected to each other through connection portions 61A.

The vapor film deposition method is not particularly limited insofar as the gate electrodes 45 and the pixel electrodes 6 which are separated from each other can be formed collectively (simultaneously). For example, a chemical deposition method (CVD), such as plasma CVD, thermal CVD, or laser CVD, deposition, sputtering (low-temperature sputtering), ion plating, or the like may be used. Of theses, deposition is suitably used.

When deposition is used as the vapor film formation method of the step <D1>, for example, as shown in FIG. 11, a conductive material flies from a deposition source 130 toward the insulator layer 9 through a mask 131 which covers only the peripheral portion including part of the respective connection electrodes 8.

Then, the gate electrodes 45 are formed on the gate insulator layer 44 around the bottom of the respective through portions 91, and the electrodes 6A are formed on the insulator layer 9 in the vicinity of the respective through portions 91.

At this time, as described above, the through portions 91 have an inversely tapered sectional shape, such that the gate electrodes 45 and the electrodes 6A are formed to be separated from each other.

In this way, the electrodes can be formed on the gate insulator layer 44 around the bottom of the respective through portions 91 and on the insulator layer 9 in the vicinity of the respective through portions 91 simultaneously so as not to come into contact with each other by the vapor film formation method.

D2

Next, as shown in FIGS. 12A and 12B, a plurality of pixel electrodes 6 are formed by using the electrodes 6A.

Specifically, the connection portions 61A of the electrodes GA are removed, such that removed portions 61 are formed and a plurality of pixel electrodes 6 are obtained.

As described above, the step (separation step) of partially removing the electrodes 6A formed on the insulator layer 9 is provided, such that adjacent pixel electrodes 6 can be individualized (isolated from each other). The separation step is carried out comparatively simply by laser or machining.

When the connection portions 61A of the electrodes 6A are removed by a laser 140, as the laser 140, any laser may be used without being particularly limited insofar as the connection portions 61A can be removed. For example, excimer laser (for example, KrF with about 5 W and 300 Hz) may be suitably used.

In this way, the pixel electrodes 6 can be formed by using the electrodes 6A formed on the insulator layer 9.

Instead of the above-described method, as shown in FIG. 13, the connection portions 61A may be cut by using a press machine 150.

As shown in FIG. 14A, the portions of the insulator layer 9 corresponding to the respective pixel electrodes 6 may be separated from each other. In this case, in the step <D2>, electrodes 45A which should become the gate electrodes (electrodes) 45 (electrodes 3A which should become the second wiring lines 3) are formed on the gate insulator layer 44, and a plurality of pixel electrodes 6 are formed on the insulator layer 9. Thus, in the step <D2>, as shown in FIG. 14B, the electrodes 45A may be partially cut or removed to form removed portions 451 such that the gate electrodes 45 are separated from each other. Therefore, a plurality of gate electrodes 45 can be formed by using the electrodes 45A.

When the connection portions 61A are mechanically cut by using the press machine 150, the substrate 7, the gate insulator layer 44, and the insulator layer 9 are preferably formed mainly of high-molecular-weight materials. Thus, even when mechanical pressure is applied to the substrate 7, the gate insulator layer 44, and the insulator layer 9 at the time of cutting of the connection portions 61A by the press machine 150, the substrate 7, the gate insulator layer 44, and the insulator layer 9 can be prevented from being cracked.

E. Protective Film Formation Step

Next, as shown in FIG. 11B, an insulating protective film 12 is formed so as to bury the through portions 91. Thus, the gate electrodes 45, the pixel electrodes 6 and the gate electrodes 45, and the like can be prevented from being resistively short-circuited.

The protective film 12 may be formed by the same method as in the step [3].

As the material for the protective film 12, the same materials as the gate insulator layer 44 or the insulator layer 9 may be used.

The protective film 12 may be provided or omitted as occasion demands.

Through the above-described steps, the active matrix device 1 shown in FIGS. 1 and 2 is obtained.

According to the manufacturing method of the active matrix device 1 described above, the number of etching processes can be reduced, as compared with a case where a conductor layer uniformly formed on a gate insulating film is patterned by etching to form gate electrodes and pixel electrodes. As a result, excellent productivity can be achieved.

Electro-Optical Device

Next, an electrophoretic display device including the above-described active matrix device which is an example of an electro-optical device according to an embodiment of the invention will be described. An electro-optical device according to an embodiment of the invention is not particularly limited insofar as the electro-optical device includes the above-described active matrix device according to the embodiment of the invention, and may be applied to a liquid crystal display (liquid crystal device), an electroluminescence device, such as organic EL device or an inorganic EL device, or the like, in addition to the electrophoretic display device.

Figure 16:
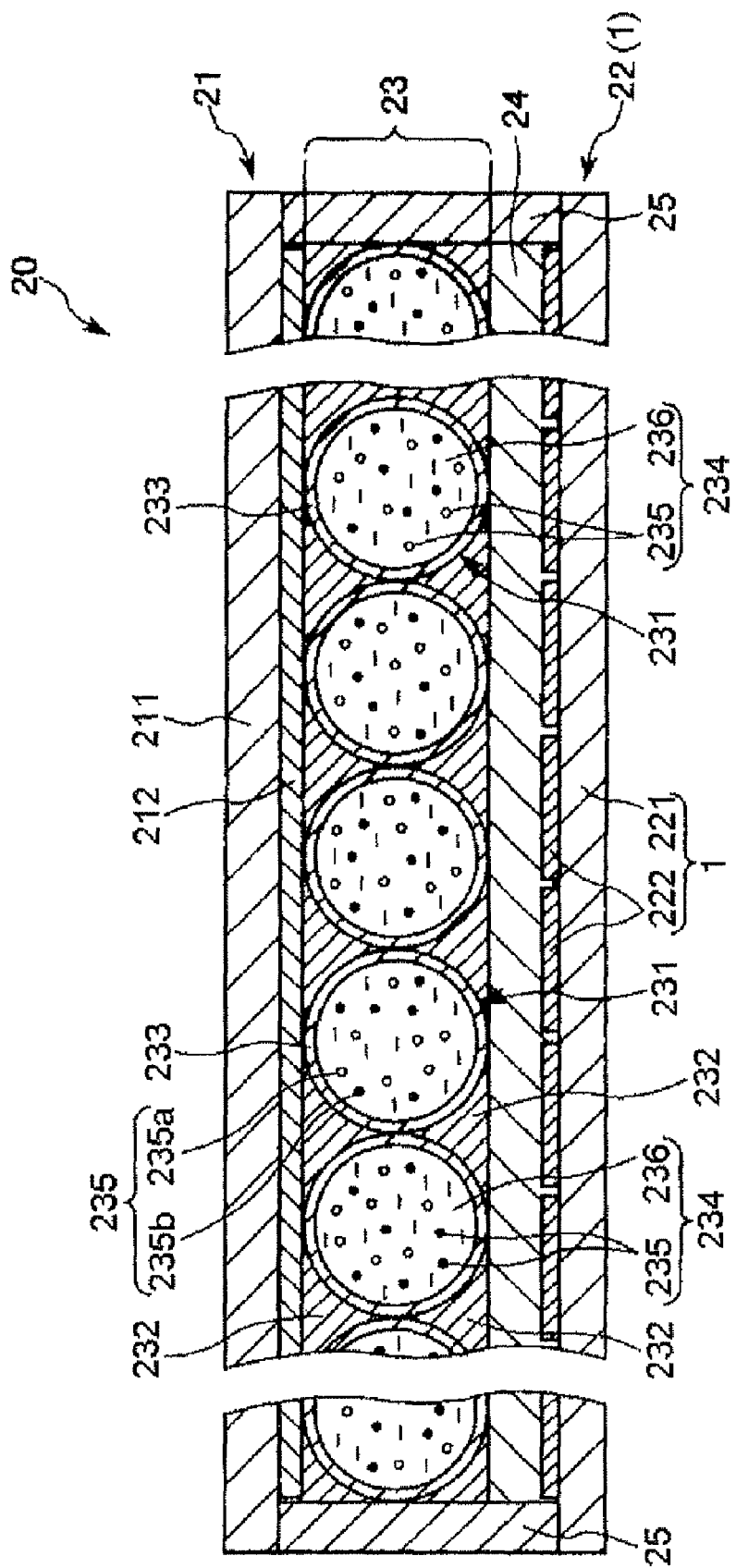
FIG. 16 is a longitudinal sectional view schematically showing an embodiment where an electro-optical device of the invention is applied to an electrophoretic display device.

FIG. 16 is a longitudinal sectional view schematically showing an embodiment where an electro-optical device of the invention is applied to an electrophoretic display device. In the following description, for convenience of description, the upper side of FIG. 16 is referred to as "above", and the lower side is referred to as "below".

An electrophoretic display device 20 shown in FIG. 16 has an electrophoretic display sheet (front plane) 21, a circuit board (back plane) 22 which is the above-described active matrix device 1, an adhesive layer 24 which bonds the electrophoretic display sheet 21 and the circuit board 22 to each other, and a seal portion 25 which seals the space between the electrophoretic display sheet 21 and the circuit board 22 airtight.

The electrophoretic display sheet 21 has a flat plate-shaped base portion 211, an electrode (common electrode) 212 provided on the lower surface of the base portion 211, and an electrophoretic dispersion liquid layer (microcapsule-contained layer) 23 provided on the lower side (one surface) of the electrode 212. The electrophoretic dispersion liquid layer 23 contains microcapsules 231 and a binder 232.

The circuit board 22 has a flat plate-shaped base portion 221, a plurality of electrodes 222 provided on the upper surface of the base portion 221, and transistors (not shown). The circuit board 22 has the same configuration as the above-described active matrix device 1.

Hereinafter, the configuration of the respective portions will be sequentially described.

The base portion 211 and the base portion 221 are formed by sheet-like (flat plate-shaped) members, and have a function for supporting and protecting the respective members disposed therebetween.

As the base portion 211 and the base portion 221, the same as the substrate 7 of the above-described active matrix device 1 may be used.

The electrode 212 serving as a common electrode is formed on the surface of the base portion 211 facing the electrophoretic dispersion liquid layer 23. A plurality of electrodes 222 serving as individual electrodes (pixel electrodes) are provided on the surface of the base portion 221 facing the electrophoretic dispersion liquid layer 23.

If a voltage is applied between the electrode 212 and the electrodes 222, an electric field is generated between the electrode 212 and the electrodes 222, and the electric field is applied to electrophoretic particles (display particles) 235 of the electrophoretic dispersion liquid layer 23.

In this embodiment, the electrode 212 becomes a common electrode, and the electrodes 222 become individual electrodes (pixel electrodes connected to transistors) divided in a matrix. A portion where the electrode 212 and one electrode 222 overlap each other forms one pixel.

The electrode 212 may be divided plurally in the same manner as the electrodes 222.

The electrodes 212 may be divided in a stripe shape, the electrodes 222 may be divided in a stripe shape in the same manner as the electrode 212, and the electrodes 212 and the electrodes 222 may be arranged so as to cross each other.

As the materials for the electrodes 212 and 222, the same materials as the materials for the pixel electrodes 6 of the active matrix device 1 may be used.

Of the base portions 211 and 221 and the electrodes 212 and 222, the base portion and the electrode arranged on the display surface (in this embodiment, the base portion 211 and the electrode 212) has light transmittance, that is, is substantially transparent (clear and colorless, clear and colorful, or translucent). Thus, the states of the electrophoretic particles 235 in the electrophoretic dispersion liquid layer 234 described below, that is, information (image) displayed on the electrophoretic display device 20 can be easily recognized through visual observation.

In the electrophoretic display sheet 21, the electrophoretic dispersion liquid layer 23 is provided to be in contact with the lower surface of the electrode 212.

The electrophoretic dispersion liquid layer 23 is configured such that a plurality of microcapsules 231 each having a capsule body (shell) 233 filled with an electrophoretic dispersion liquid 234 are fixed (held) by the binder 232.

The microcapsules 231 are arranged between the electrode 212 and the electrodes 222 in a single layer (one by one so as not to overlap in the thickness direction). In this embodiment, the microcapsules 231 substantially have a spherical shape without contracting (being pressed) in the up-down direction even in a state of being sandwiched between the electrode 212 and the adhesive layer.

The microcapsules 231 may be pressed in the up-down direction and may have, for example, a shape close to an elliptical or rectangular shape in longitudinal sectional view.

With regard to the particle size of the capsule body 233, the volume-average particle size is preferably in a range of 30 to 60 μm, and more preferably in a range of 40 to 50 μm. The particle size of the capsule body 233 is within the above-described range, and therefore the electrophoretic dispersion liquid layer 23 can be formed with accurate dimension.

Examples of the material for the capsule body (shell) 233 include various resin materials, such as urethane-based resin, melamine-based resin, urea-formaldehyde resin, polyamide, and polyether. These materials may be used alone, or two or more materials may be used in combination.

The material for the capsule body 233 may be cross-linked (three-dimensionally cross-linked) by a cross-linking agent. Thus, strength of the capsule body 233 can be further improved. As a result, the microcapsules 231 can be further prevented from being collapsed.

Although in this embodiment, adjacent microcapsules 231 are arranged to be in contact with each other, adjacent microcapsules 231 may be arranged to be separated from each other.

The microcapsules 231 include white particles 235a and colored particles (black particles) 235b, as described below. Thus, the electrophoretic particles 235 included in the microcapsules 231 operate as described below, such that uniform display can be performed.

The electrophoretic dispersion liquid 234 filled in the capsule body 233 is produced by dispersing (suspending) at least one kind of electrophoretic particles 235 (in this embodiment, two kinds of particles of colored particles 235b and white particles 235a) in a liquid-phase dispersion medium 236.

In dispersing the electrophoretic particles 235 in the liquid-phase dispersion medium 236, for example, one of a paint shaker method, a ball mill method, a media mill method, an ultrasonic dispersion method, and a stirrer dispersion method may be used, or two or more methods may be used in combination.

A dispersion medium that exhibits low solubility to the capsule body 233 and has relatively high insulation is suitably used as the liquid-phase dispersion medium 236.

Specifically, the liquid-phase dispersion medium 236 is not particularly limited, and, for example, a material mainly containing aliphatic hydrocarbon (liquid paraffin) is suitably used. The liquid-phase dispersion medium 236 mainly containing liquid paraffin is excellent in suppressing clumping of the electrophoretic particles 235 and exhibits low affinity with (low solubility to) the material for the capsule body 233. For this reason, deterioration in the display performance of the electrophoretic display device 20 with time can be further reliably prevented or suppressed. Liquid paraffin is preferably used, because there is no unsaturated bonding, and therefore excellent weather resistance and high safety are achieved.

If necessary, various additives may be added to the liquid-phase dispersion medium 236 (electrophoretic dispersion medium 234). Examples of such additives include a charge-controlling agent formed of particles of an electrolyte, a (an-ionic or cationic) surfactant, metal soap, a resin material, a rubber material, oil, varnish, or a compound, a dispersion agent, such as a titanium-based coupling agent, an aluminum-based coupling agent, or a silane-based coupling agent, a lubricating agent, a stabilizing agent, and the like.

If necessary, various dyes may be dissolved in the liquid-phase dispersion medium 236.

The electrophoretic particles 235 may be of any type insofar as the electrophoretic particles are charged and can be electrophoretically moved in the liquid-phase dispersion medium 236 under the action of the electric field. Although the electrophoretic particles are not particularly limited, at least one of pigment particles, resin particles, and composite particles thereof may be suitably used. These particles provide advantages in that the particles can be manufactured easily and can perform charge-control comparatively easily.

The average particle size of the electrophoretic particles 235 is preferably in a range of about 10 to 500 nm, and more preferably in a range of about 20 to 300 nm. If the average particle size of the electrophoretic particles 235 is within the above-described range, the electrophoretic particles 235 can be reliably prevented from clumping together or sinking in the liquid-phase dispersion medium 236. As a result, the display quality of the electrophoretic display device 20 can be suitably prevented from being deteriorated.

The binder 232 is supplied, for example, for the sake of fixing the microcapsules 231 to the electrodes 212, ensuring insulation between the electrodes 222 and the electrode 212, and the like. Therefore, durability and reliability of the electrophoretic display device 20 can be improved.

For the binder 232, a resin material which exhibits high affinity with (improved adhesion to) the electrodes 222 and 212 and the capsule bodies 233 (microcapsules 231) and has excellent insulation is suitably used.

In this embodiment, the electrophoretic display sheet 21 and the circuit board 22 are bonded to each other through the adhesive layer 24. Thus, the electrophoretic display sheet 21 and the circuit board 22 can be further reliably fixed to each other.

In addition to the function for bonding (fixing) the electrophoretic display sheet 21 and the circuit board 22 to each other, the adhesive layer 24 preferably has I: a function for ensuring insulation, II: a function for preventing ions from spreading from the electrophoretic display sheet 21 toward the circuit board 22, and III: a function for mitigating stress when the electrophoretic display sheet 21 and the circuit board 22 are bonded to each other.

With the function I, the electrodes 222 and the electrode 212 can be reliably prevented from being short-circuited, such that an electric field can be reliably applied to the electrophoretic particles 235.

With the function II, degradation in the characteristics of the circuits (in particular, the transistors) provided in the circuit board 22 can be prevented or suppressed.

With the function III, in manufacturing (producing) the electrophoretic display device 20, the microcapsules 231 or the transistors provided in the circuit board 22 can be prevented from being broken.

The adhesive layer 24 is preferably formed mainly of polyurethane. Polyurethane is preferably used because the adhesive layer 24 can be reliably given various functions described above.

As the material for the adhesive layer 24, instead of polyurethane, for example, various resin materials, such as polyethylene, chlorinated plyethylene, ABS resin, vinyl-acrylic acid ester copolymer, fluorine-based resin, and silicon-based resin may be used. These materials may be used alone, or two or more materials may be used in combination.

The seal portion 25 is provided between the base portion 211 and the base portion 221 along the edges of the base portion 211 and the base portion 221. The seal portion 25 seals the electrodes 222 and 212, the electrophoretic dispersion liquid layer 23, and the adhesive layer 24 airtight. Thus, moisture can be prevented from being infiltrated into the electrophoretic display device 20, such that the display performance of the electrophoretic display device 20 can be reliably prevented from being deteriorated.

Examples of the material for the seal portion 25 include various resin materials, such as thermoplastic resin, for example, acryl-based resin, urethane-based resin, and olefin-based resin, and thermosetting resin, for example epoxy-based resin, melamine-based resin, and phenol-based resin. These materials may be used alone, or two or more materials may be used in combination.

The seal portion 25 may be provided or omitted as occasion demands.

The electrophoretic display device 20 is activated as follows.

Hereinafter, the activation (operation) method of the electrophoretic display device 20 will be described.

If a voltage is applied between the electrodes 222 and the electrode 212 of the electrophoretic display device 20, an electric field is generated between the electrodes 222 and the electrode 212. That is, an electric field is generated in the electrophoretic dispersion liquid layer 23.

The electrophoretic particles 235 (colored particles 235b and white particles 235a) are electrophoretically moved toward one of the electrodes in accordance with the electric field generated in the electrophoretic dispersion liquid layer 23.

For example, when positively charged particles are used as the white particles 235a, and negatively charged particles are used as the colored particles (black particles) 5b, if the electrode 222 is at a positive potential, the white particles 235a are moved toward the electrodes 212 and gathered on the electrodes 212. Meanwhile, the colored particles 235b are moved toward the electrode 222 and gathered on the electrodes 222. For this reason, when the electrophoretic display device 20 is viewed from above (display surface side), the color of the white particles 235a, that is, a white color, is viewed.

In contrast, if the electrode 222 is at a negative potential, the white particles 235a are moved toward the electrode 222 and gathered on the electrode 222. Meanwhile, the colored particles 235b are moved toward the electrodes 212 and gathered on the electrodes 212. For this reason, when the electrophoretic display device 20 is viewed from above (display surface side), the color of the colored particles 235b, that is, a black color, is viewed.

With this configuration, if the amount of charges of the electrophoretic particles 235 (white particles 235a and colored particles 235b), the polarity of the electrode 222 or 4, the potential difference between the electrodes 222 and 4, and the like are appropriately set, desired information (image) is displayed on the display surface of the electrophoretic display device 20 according to the combination of colors of the white particles 235a and the colored particles 235b, the number of particles gathered on the electrodes 222 and 212, and the like.

The electrophoretic display device 20 (electro-optical device) includes the above-described active matrix device 1, such that excellent productivity is achieved.

Electronic Apparatus

The above-described electrophoretic display device 20 can be incorporated into various electronic apparatuses. Hereinafter, an electronic apparatus including the electrophoretic display device 20 according to an embodiment of the invention will be described.

Electronic Paper

First, an embodiment where an electronic apparatus of the invention is applied to an electronic paper will be described.

Figure 17:
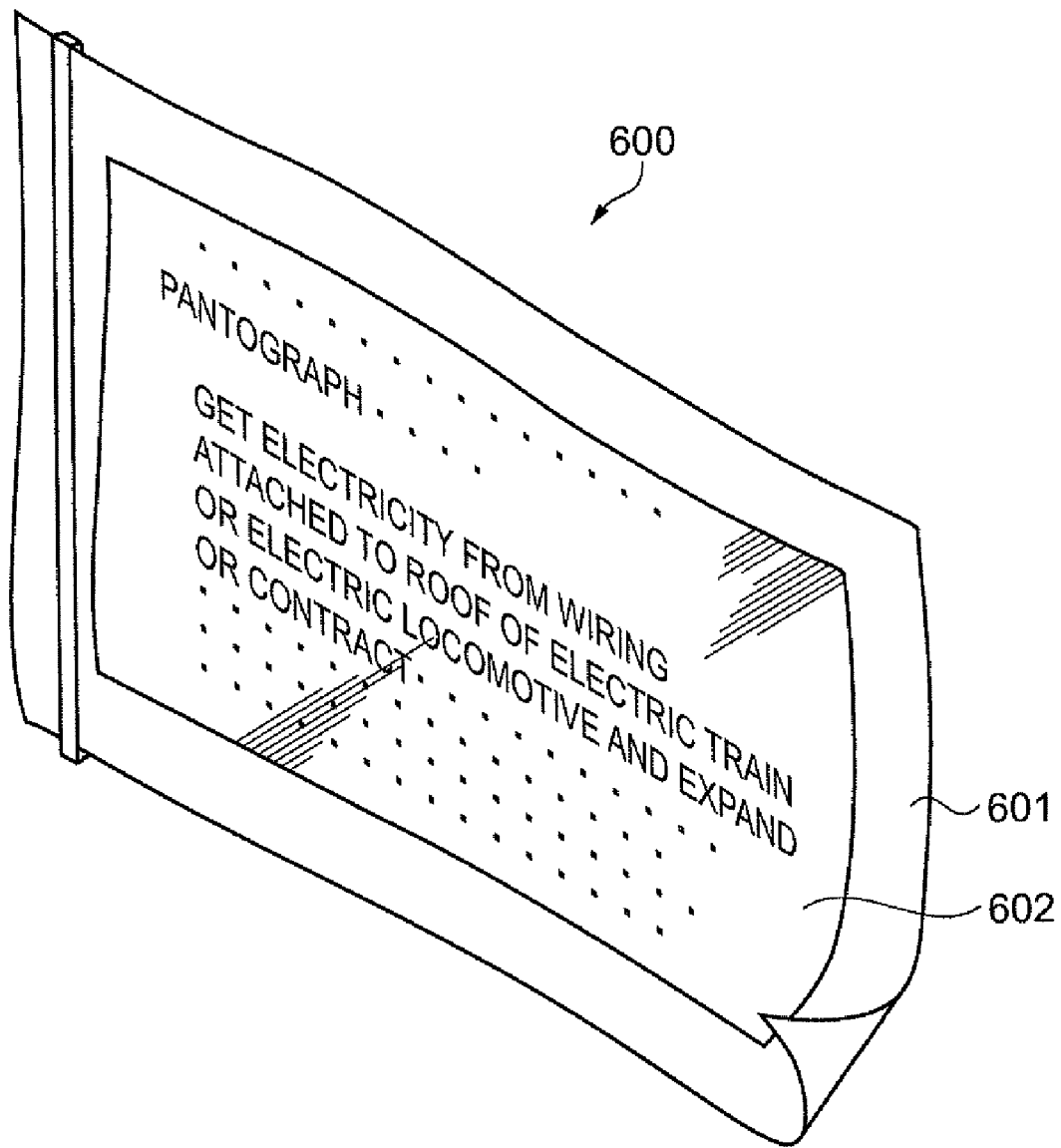
FIG. 17 is a perspective view showing an embodiment where an electronic apparatus of the invention is applied to an electronic paper.

FIG. 17 is a perspective view showing an embodiment where an electronic apparatus of the invention is applied to an electronic paper.

An electronic paper 600 shown in FIG. 17 includes a main body 601 which is formed of a rewritable sheet having the same texture and flexibility as a paper sheet, and a display unit 602.

Figure 18A:
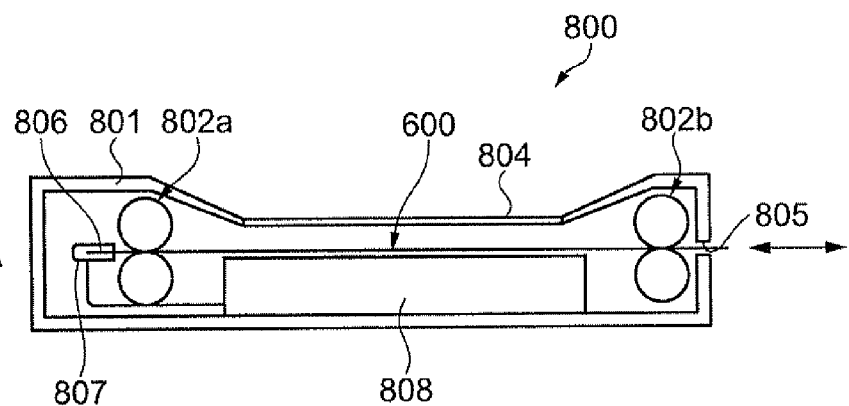
FIGS. 18A and 18B are diagrams showing an embodiment where an electronic apparatus of the invention is applied to a display.
Figure 18B:
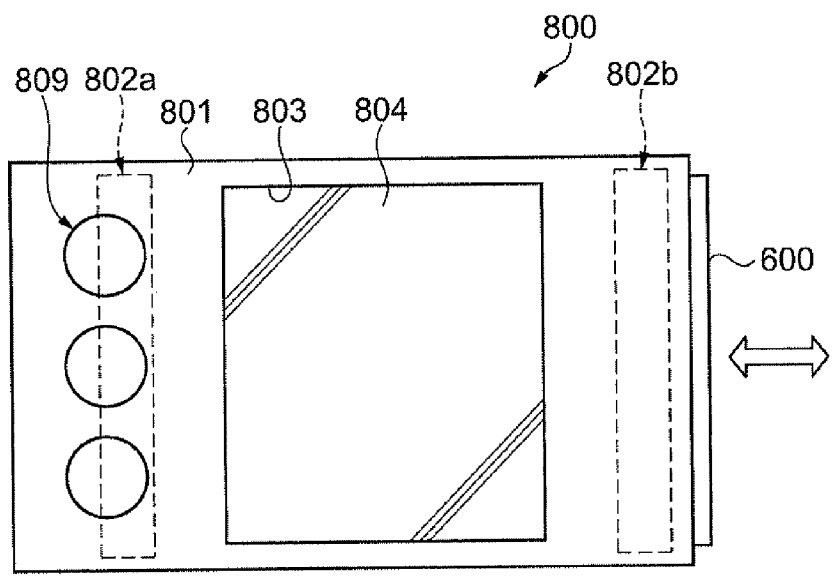

In the electronic paper 600, the display unit 602 is formed by the above-described electrophoretic display device 20. Display Next, an embodiment where an electronic apparatus of the invention is applied to a display will be described. FIGS. 18A and 18B are diagrams showing an embodiment where an electronic apparatus of the invention is applied to a display. FIG. 18A is a sectional view, and FIG. 18B is a plan view.

A display (display device) 800 shown in FIGS. 18A and 183 includes a main body portion 801, and an electronic paper 600 provided detachably with respect to the main body portion 801. The electronic paper 600 has the above-described configuration, that is, the same configuration as shown in FIG. 17.

The main body portion 801 is provided with an insertion slot 805, through which the electronic paper 600 can be inserted, at the side portion (the right side in FIG. 18A). Two pairs of transport rollers 802a and 802b are provided within the main body portion 801. If the electronic paper 600 is inserted into the main body portion 801 through the insertion slot 805, the electronic paper 600 is provided in the main body portion 801 in a state of being sandwiched by the pairs of transport rollers 802a and 802b.

A rectangular opening 803 is formed on the display surface side (the front side in FIG. 18B) of the main body portion 801, and a transparent glass plate 804 is fitted to the opening 803. This allows the electronic paper 600 held within the main body portion 801 to be visually recognized from the outside of the main body portion 801. That is, the display 800 has a display surface that allows the electronic paper 600 held within the main body portion 801 to be visually recognized through the transparent glass plate 804.

A terminal portion 806 is formed at the front end of the electronic paper 600 in the insertion direction (the left side in FIGS. 18A and 18B). Provided within the main body portion 801 is a socket 807 to which the terminal portion 806 is connected in a state where the electronic paper 600 is held within the main body portion 801. A controller 808 and an operation portion 809 are electrically connected to the socket 807.

In the display 800, the electronic paper 600 is provided detachably with respect to the main body portion 801, and is portable in a state of being detached from the main body portion 801.

In the display 800, the electronic paper 600 is formed by the electrophoretic display device 20 described above.

The electronic apparatus includes the above-described active matrix device 1, such that excellent productivity is achieved.

The electronic apparatus according to the embodiment of the invention is not limited to the application as described above. For example, the invention may be applied to, for example, a television, a view-finder-type or a monitor-direct-view type video tape recorder, a car navigation system, a pager, an electronic organizer, an electronic calculator, an electronic newspaper, a word processor, a personal computer, a workstation, a video phone, a POS terminal, and a touch panel-equipped apparatus. The electrophoretic display device 20 may be applied to a display unit for various electronic apparatuses.

Although the method of manufacturing a semiconductor device, the semiconductor device, the active matrix device, the electro-optical device, and the electronic apparatus according to the invention have been described on the basis of the embodiment shown in the drawings, the invention is not limited thereto.

For example, in the manufacturing method of a semiconductor device according to the embodiment of the invention, one or two or more steps for arbitrary purposes may be added. For example, in the semiconductor device, the active matrix device, the electro-optical device, and the electronic apparatus according to the embodiment of the invention, the configuration of the respective units may be substituted with arbitrary configuration having the same functions, or arbitrary may be added.

Although in the foregoing embodiment, a case where the insulator layer 9 is formed after the gate insulator layer 44 is formed has been described, an insulator layer having through portions, such as the through portions 91, may be formed before the gate insulator layer is formed, and the gate insulator layer may be formed in the through portions of the insulator layer.

What is claimed is:

1. A semiconductor device comprising:
a substrate;
transistors each having a source electrode and a drain electrode provided on a surface of the substrate to be separated from each other, a semiconductor layer provided at least between the source electrode and the drain electrode, a gate insulator layer provided so as to cover a surface of the semiconductor layer opposite to the substrate, and a gate electrode provided on a surface of the gate insulator layer opposite to the semiconductor layer;
an insulator layer provided on a surface of the gate insulator layer opposite to the semiconductor layer; and
pixel electrodes each provided on a surface of the insulator layer opposite to the gate insulator layer and electrically connected to the corresponding source electrode or the corresponding drain electrode,
wherein the insulator layer has through portions, each of which passes therethrough in the thickness direction with an increasing width from the corresponding pixel electrode side toward the gate insulator layer side, and
the gate electrode is provided on the gate insulator layer around the bottom of the corresponding through portion.

2. The semiconductor device according to claim 1,
wherein conductor portions are provided so as to pass through the gate insulator layer and the insulator layer in the thickness direction and to electrically connect the source electrodes or the drain electrodes and the pixel electrodes to each other.

3. The semiconductor device according to claim 1,
wherein the gate electrodes and the pixel electrodes are formed simultaneously by a vapor film formation method.

4. An active matrix device comprising:
the semiconductor device according to claim 1.

5. An electro-optical device comprising:
the active matrix device according to claim 4.

6. An electronic apparatus comprising:
the electro-optical device according to claim 5.

* * * * *